(12) United States Patent
Takamine

(10) Patent No.: US 7,425,882 B2
(45) Date of Patent: Sep. 16, 2008

(54) BALANCED-TYPE SURFACE ACOUSTIC WAVE FILTER

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 309 days.

(21) Appl. No.: 10/595,383

(22) PCT Filed: Aug. 10, 2005

(86) PCT No.: PCT/JP2005/014672

§ 371 (c)(1),
(2), (4) Date: Apr. 13, 2006

(87) PCT Pub. No.: WO2006/022143

PCT Pub. Date: Mar. 2, 2006

(65) Prior Publication Data

US 2006/0208834 A1    Sep. 21, 2006

(30) Foreign Application Priority Data

Aug. 23, 2004   (JP) .............................. 2004-242520

(51) Int. Cl.
*H03H 9/64* (2006.01)
(52) U.S. Cl. .................................. 333/193; 333/195
(58) Field of Classification Search ................ 333/193, 333/195
See application file for complete search history.

(56) References Cited

U.S. PATENT DOCUMENTS

| | | | |
|---|---|---|---|
| 2002/0000898 A1* | 1/2002 | Takamine | .................... 333/195 |
| 2002/0021195 A1 | 2/2002 | Takamine | |
| 2002/0175783 A1 | 11/2002 | Watanabe et al. | |
| 2003/0227359 A1 | 12/2003 | Ouchi | |
| 2004/0095207 A1* | 5/2004 | Nakamura et al. | .......... 333/133 |
| 2004/0201435 A1* | 10/2004 | Ouchi et al. | ................. 333/195 |

FOREIGN PATENT DOCUMENTS

JP    06-204781 A    7/1994

(Continued)

OTHER PUBLICATIONS

International Search Report issued in the corresponding International Application No. PCT/JP2005/014672, mailed on Dec. 13, 2005.

*Primary Examiner*—Barbara Summons
(74) *Attorney, Agent, or Firm*—Keating & Bennett, LLP

(57) ABSTRACT

In a balanced-type surface acoustic wave filter, IDTs in the center of each of first and second longitudinally coupled resonator type surface acoustic wave filter sections are connected to an unbalanced input terminal, first and third IDT sections on both the sides of the center IDT are connected to first and second balanced output terminals, respectively, the first and third IDTs have narrow pitch electrode finger sections N, and when an electrode finger pitch of the narrow pitch electrode finger section of the second IDT is P1, an electrode finger pitch of the narrow pitch electrode finger section of the first and third IDTs is P2, the number of electrode fingers of the second IDT except for the narrow pitch electrode finger section of the IDT is K1, and the number of electrode fingers of the first and third IDT except for the narrow pitch electrode finger section is K2, P1>P2 and $1.12 \leq K1/K2 \leq 1.65$ are satisfied.

18 Claims, 11 Drawing Sheets

FOREIGN PATENT DOCUMENTS

| | | |
|---|---|---|
| JP | 11-97966 A | 4/1999 |
| JP | 2001-308672 A | 11/2001 |
| JP | 2002-111432 A | 4/2002 |
| JP | 2003-092527 A | 3/2003 |
| JP | 2003-115746 A | 4/2003 |
| JP | 3419402 B | 4/2003 |
| JP | 2003-179462 A | 6/2003 |
| JP | 2003-243965 A | 8/2003 |
| JP | 2004-48675 A | 2/2004 |

* cited by examiner

S11

S22

S11

S22

S11

S22

S11

S22

RESONANT MODE
CORRESPONDING TO B POINT
(0TH MODE)

RESONANT MODE
CORRESPONDING TO A POINT
(2ND MODE)

RESONANT MODE
CORRESPONDING TO C POINT

BALANCED-TYPE SURFACE ACOUSTIC WAVE FILTER

BACKGROUND OF THE INVENTION

1. Field of the Invention

The present invention relates to a balanced-type surface acoustic wave filter provided with a balance-unbalance conversion function, and more particularly, to a balanced-type surface acoustic wave filter in which an IDT has a narrow pitch electrode finger section and an input/output impedance ratio is set to a specific value.

2. Description of the Related Art

In the related art, a balanced-type surface acoustic wave filter provided with a balance-unbalance conversion function is widely used in communications equipment, such as mobile phones. For example, Japanese Unexamined Patent Application Publication No. 2001-308672 (Patent Document 1) described below discloses a balanced-type surface acoustic wave filter, which is shown in FIG. 26.

In a balanced-type surface acoustic wave filter 501 shown in FIG. 26, longitudinally coupled resonator type surface acoustic wave filters 503 and 504 are connected to an unbalanced input terminal 502. The surface acoustic wave filters 503 and 504 include first to third IDTs (interdigital transducers) 503a to 503c and 504a to 504c arranged in the surface acoustic wave propagating direction, respectively. The second IDTs 503b and 504b in the center are electrically connected to the unbalanced input terminal 502. In the surface acoustic wave propagating direction, the first and third IDTs 503a and 503c arranged on both the sides of the IDT 503b are electrically connected to a first balanced output terminal 505, and the first and third IDTs 504a and 504c arranged on both the sides of the IDT 504b in the center of the surface acoustic wave filter 504 are electrically connected to a second balanced output terminal 506.

In the balanced-type surface acoustic wave filter 501, the input impedance on the unbalanced input terminal 502 side is set to 50 Ω, and characteristic impedances on the sides of the first and second balanced output terminals 505 and 506 are set to 150 Ω. That is, the input/output impedance ratio is set to 1:3. This is because an antenna is connected to an input terminal of the balanced-type surface acoustic wave filter 501 and the impedance is usually set to 50 Ω, whereas the input impedance of an IC connected to the output side is set to 150Ω.

Japanese Unexamined Patent Application Publication No. 6-204781 (Patent Document 2) and Japanese Unexamined Patent Application Publication No. 11-97966 (Patent Document 3) described below respectively disclose balanced-type surface acoustic wave filters provided with a balance-unbalance conversion function similar to the balanced-type surface acoustic wave filter described in Patent Document 1, but having different electrode configurations. In addition, in the balanced-type surface acoustic wave filters described in Patent Documents 2 and 3, the impedance ratio between the unbalanced signal terminal and the balanced signal terminal is set to about 1:3 to about 1:4.

On the other hand, in recent years, a balanced-type mixer IC with an input impedance of about 100 Ω is commercially available as an IC to be connected to the output side of the balanced-type surface acoustic wave filter of this kind. To cope with such an IC, the output impedance of the balanced-type surface acoustic wave filter connected to the IC must be set to about 100 Ω. Then, to set the impedance on the input terminal side to 50 Ω, an input/output impedance ratio of the surface acoustic wave filter is required to be 1:2.

Japanese Unexamined Patent Application Publication No. 2004-48675 (Patent Document 4) described below discloses a balanced-type surface acoustic wave filter provided with a balance-unbalance conversion function in which the impedance ratio between an unbalanced signal terminal and a balanced signal terminal is set to 1:2. FIG. 27 is a plan view showing the electrode configuration of the balanced-type surface acoustic wave filter described in Patent Document 4. In a balanced-type surface acoustic wave filter 601, connected to an unbalanced input terminal 602 are longitudinally coupled resonator type surface acoustic wave filter sections 603 and 604. The longitudinally coupled resonator type surface acoustic wave filter sections 603 and 604 respectively include first to third IDTs 603a to 603c and 604a to 604c arranged in the surface acoustic wave propagating direction. The IDTs 603b and 604b in the center are electrically connected to the unbalanced input terminal 602. The first and third IDTs 603a and 603c located on both the sides of the surface acoustic wave propagating direction of the IDT 603b are electrically connected to a first balanced output terminal 605. In the same manner, in surface acoustic wave filter section 604, the IDTs 604a, 604c located on both the sides of the IDT 604b in the surface acoustic wave propagating direction are electrically connected to the second balanced output terminals 606.

Here, the IDTs 603a and 603b include narrow pitch electrode finger sections N in the neighborhood of the areas adjacent to each other with a gap interposed therebetween in the surface acoustic wave propagating direction. That is, the electrode finger pitch of the area of IDT 603a near the IDT 603b has a narrower electrode finger pitch as compared to the rest of the areas. This IDT area where the electrode finger pitch is relatively narrow is referred to as a narrow pitch electrode finger section N. In the same manner, the area of IDT 603b near the IDT 603a at the side end is provided with a narrow pitch electrode finger section N. Furthermore, in the IDTs 603b and 603c and IDTs 604a to 604c as well, the respective neighborhoods of the adjacent areas with the gap are provided with the narrow pitch electrode finger section N.

Patent Document 4 also describes that in the balanced-type surface acoustic wave filter 601, the IDTs 603b and 604b on the unbalanced side and the IDTs 603a, 603c, 604a, and 604c on the balanced side are set to have different numbers of the electrode fingers, whereby the input/output impedance ratio can be set to 1:2.

In the surface acoustic wave filter, the impedance of the IDT decreases as an electrode finger cross width is increased and the number of electrode fingers is increased. In the surface acoustic wave filter 601 shown in FIG. 25, for example, the IDT 603b in the center of the surface acoustic wave filter section 603 is connected to the unbalanced input terminal 602, the IDTs 603a and 603c on both the sides are connected to the first balanced output terminal 605.

Therefore, to adjust the impedance ratio between the unbalanced signal terminal and the balanced signal terminal, the cross width of the IDT 603b and the cross widths of the IDTs 603a and 603c cannot be different from one another. Therefore, as described above, the number of the electrode fingers of the IDT 603b on the unbalanced side and the numbers of the electrode fingers of the IDTs 603a and 603c on the balanced side are made different from each other, and the input/output impedance ratio is changed. For example, the impedance of the first balanced output terminal is a value depending on the number of the electrode fingers of the IDT 603a on the balanced side. This is because the IDTs 603a and 603c are connected in parallel with respect to a balanced output terminal 605 and at the same time the balanced output terminal 605 and the balanced output terminal 606 are connected in series via a ground potential. In contrast to this, the impedance of the unbalanced terminal 602 side has a value corresponding to ½ of the number of the electrode fingers of the IDT 603*b* on the unbalanced side. That is, when the number of the electrode fingers of the IDT 603*b* on the unbalanced side is set to ½ of the number of the electrode fingers of the IDT 603*a* on the balanced side, the impedance ratio between the unbalanced signal terminal and the balanced signal terminal can be set to 1:2

However, the ratio between the numbers of the IDT 603*b* and 604*b* on the unbalanced side and the numbers of the IDTs 603*a*, 603*c*, 604*a*, and 604*c* on both sides thereof is changed, and a problem occurs in that an influence is imparted to resonant frequencies of a plurality of resonant modes for obtaining a pass band of the surface acoustic wave filter 601. Thus, the number ratio cannot be significantly changed. Since the number of the IDT on the unbalanced side is much less than the numbers of the IDTs 603*a* and 603*c* on the balanced side, there is also a problem in that a sufficient band width of a filter cannot be obtained.

In addition, with a method of changing the ratio between the numbers of the electrode fingers, the impedance ratio between the unbalanced signal terminal and the balanced signal terminal cannot be precisely set to 1:2, and the set ratio is often shifted from 1:2.

SUMMARY OF THE INVENTION

In order to overcome the problems described above, preferred embodiments of the present invention provide a surface acoustic wave filter provided with a balance-unbalance conversion function, in which the degree of freedom for adjusting impedances of a plurality of resonant modes for obtaining a pass band is increased without degrading filter characteristics, such as a band width and a loss, and accordingly, the impedance ratio between the unbalanced signal terminal and the balanced signal terminal can be easily precisely set to 1:2 or other desired ratios, and, in addition, a sufficient band width is obtained.

A first preferred embodiment of the present invention is a balanced-type surface acoustic wave filter connected to an unbalanced terminal and first and second balanced terminals and provided with a balance-unbalance conversion function, including a piezoelectric substrate, a first surface acoustic wave filter section including first to third IDTs arranged along a surface acoustic wave propagating direction on the piezoelectric substrate, the second IDT in the center or the first and third IDTs on both sides of the second IDT being connected to the unbalanced terminal, and the first and third IDTs on both sides of the second IDT or the second IDT in the center being connected to the first balanced terminal, and a second surface acoustic wave filter section including first to third IDTs arranged in the surface acoustic wave propagating direction on the piezoelectric substrate, the second IDT in the center or the first and third IDTs on both sides of the second IDT being connected to the unbalanced terminal, the first and third IDTs on both sides of the second IDT or the second IDT in the center being connected to the second balanced terminal, and the second surface acoustic wave filter section being arranged to have a phase of an output signal to an input signal different by about 180 degrees with respect to the first surface acoustic wave filter section, wherein in the first and second surface acoustic wave filter sections, in a pair of IDTs adjacent to each other with a gap interposed therebetween in the surface acoustic wave propagating direction, a section where a cycle of a portion of electrode fingers including an electrode finger facing the gap is less than a cycle of electrode fingers of a main portion of the IDT is set as a narrow pitch electrode finger section. When an electrode finger pitch of the narrow pitch electrode finger section of the IDT connected to the unbalanced terminal of the first and second surface acoustic wave filter sections is set as P1, an electrode finger pitch of the narrow pitch electrode finger section of the IDT connected to the balanced terminal is set as P2, the number of electrode fingers of the pitch electrode finger section except for the narrow pitch electrode finger section of the IDT connected to the unbalanced terminal of the first and second surface acoustic wave filter sections is set as K1, and the number of electrode fingers of the pitch electrode finger section except for the narrow pitch electrode finger section of the IDT connected to the balanced terminal is set as K2, the following relationships:

$P1 > P2$; and $1.12 \leq K1/K2 \leq 1.65$ are satisfied.

A second preferred embodiment is a balanced-type surface acoustic wave filter connected to an unbalanced terminal and first and second balanced terminals and provided with a balance-unbalance conversion function, including a piezoelectric substrate, a first surface acoustic wave filter section including first to third IDTs arranged along a surface acoustic wave propagating direction on the piezoelectric substrate, the second IDT in the center or the first and third IDTs on both sides of the second IDT being connected to the unbalanced terminal and the first and third IDTs on both sides of the second IDT or the second IDT in the center being connected to the first balance terminal, and a second surface acoustic wave filter section including first to third IDTs arranged in the surface acoustic wave propagating direction on the piezoelectric substrate, the second IDT in the center or the first and third IDTs on both sides of the second IDT being connected to the unbalanced terminal, the first and third IDTs on both sides of the second IDT or the second IDT in the center being connected to the second balanced terminal, and the second surface acoustic wave filter section being arranged to have a phase of an output signal to an input signal different by about 180 degrees with respect to the first surface acoustic wave filter section, wherein in the first and second surface acoustic wave filter sections, in a pair of IDTs adjacent to each other with a gap interposed therebetween in the surface acoustic wave propagating direction, a section where a cycle of a portion of electrode fingers including an electrode finger facing the gap is less than a cycle of electrode fingers of a main portion of the IDT is set as a narrow pitch electrode finger section. When an electrode finger pitch of the narrow pitch electrode finger section of the IDT connected to the unbalanced terminal of the first and second surface acoustic wave filter sections is set as P1, an electrode finger pitch of the narrow pitch electrode finger section of the IDT connected to the balanced terminal is set as P2, the number of electrode fingers of the pitch electrode finger section except for the narrow pitch electrode finger section of the IDT connected to the unbalanced terminal of the first and second surface acoustic wave filter sections is set as K1, the number of electrode fingers of the pitch electrode finger section except for the narrow pitch electrode finger section of the IDT connected to the balanced terminal is set as K2, the number of electrode fingers of the narrow pitch electrode finger section of the IDT connected to the unbalanced terminal of the first and second surface acoustic wave filter sections is set as K1$n$, and the number of electrode fingers of the narrow pitch electrode finger section of the IDT connected to the balanced terminal is set as K2n, the following relationships:

$P1 > P2$;

$K1n = K2n$; and $1.12 \leq K1/K2 \leq 1.65$ are satisfied.

In the balanced-type surface acoustic wave filters according to the first and second preferred embodiments, preferably, when a metallization ratio in the first and second surface acoustic wave filter sections is set as d and an electrode finger cross width is set as W, $67.4 \lambda I \leq W/d \leq 74.3 \lambda I$ (where $\lambda I$ denotes a wavelength of the IDT) is satisfied.

A third preferred embodiment is a balanced-type surface acoustic wave filter connected to a balanced terminal and first and second unbalanced terminals and provided with a balance-unbalance conversion function, including a piezoelectric substrate, and first to third IDTs arranged in a surface acoustic wave propagating direction on the piezoelectric substrate, wherein the second IDT is connected to the unbalanced terminal, and the first and third IDTs on both sides of the second IDT are respectively connected to the first and second balanced terminals, and in an area where the first to third IDTs are adjacent to one another, the respective IDTs have narrow pitch electrode finger sections and an electrode finger pitch of the narrow pitch electrode finger section is less than an electrode finger pitch of a main portion of the pitch electrode finger section of the IDT provided with narrow pitch electrode fingers, and a phase of the first IDT is reversed by about 180 degrees with respect to a phase of the third IDT, and when an electrode finger pitch of the narrow pitch electrode finger section of the second IDT located in the center is set as P1, an electrode finger pitch of the narrow pitch electrode finger section of the first and third IDTs is set as P2, the number of electrode fingers of the pitch electrode finger section except for the narrow pitch electrode finger section of the second IDT is set as K1, and the number of electrode fingers of the pitch electrode finger section except for the narrow pitch electrode finger section of the first and third IDTs is set as K2, the following relationships:

$P1 > P2$; and $1.12 \leq K1/K2 \leq 1.65$ are satisfied.

A fourth preferred embodiment is a balanced-type surface acoustic wave filter connected to a balanced terminal and first and second unbalanced terminals and provided with a balance-unbalance conversion function, including a piezoelectric substrate, and first to third IDTs arranged in a surface acoustic wave propagating direction on the piezoelectric substrate, wherein the second IDT is connected to the unbalanced terminal, the first and third IDTs on both sides of the second IDT are respectively connected to the first and second balanced terminals, and in an area where the first to third IDTs are adjacent one another, the respective IDTs have narrow pitch electrode finger sections and an electrode finger pitch of the narrow pitch electrode finger section is less than an electrode finger pitch of a main portion of the pitch electrode finger section of the IDT provided with narrow pitch electrode fingers, and a phase of the first IDT is reversed by about 180 degrees with respect to a phase of the third IDT, and when an electrode finger pitch of the narrow pitch electrode finger section of the second IDT located in the center is set as P1, an electrode finger pitch of the narrow pitch electrode finger section of the first and third IDTs is set as P2, the number of electrode fingers of the pitch electrode finger section except for the narrow pitch electrode finger section of the second IDT is set as K1, the number of electrode fingers of the pitch electrode finger section except for the narrow pitch electrode finger section of the first and third IDTs is set as K2, the number of electrode fingers of the narrow pitch electrode finger section of the second IDT is set as K1n, the number of electrode fingers of the narrow pitch electrode finger section of the first and third IDTs is set as K2n, the following relationships:

$P1 > P2$;

$K1n = K2n$; and $1.12 \leq K1/K2 \leq 1.65$ are satisfied.

In the balanced-type surface acoustic wave filters according to the third and fourth preferred embodiments, preferably, when a metallization ratio in the first to third IDTs is set as d and an electrode finger cross width is set as W, $134.8 \lambda I \leq W/d \leq 148.6 \lambda I$ (where $\lambda I$ denotes a wavelength of the IDT) is satisfied.

A fifth preferred embodiment is a balanced-type surface acoustic wave filter connected to an unbalanced terminal and first and second balanced terminals and provided with a balance-unbalance conversion function, including a piezoelectric substrate, and first to third IDTs arranged in a surface acoustic wave propagating direction on the piezoelectric substrate, wherein the first and third IDTs located on both sides of the second IDT in the surface acoustic wave propagating direction are connected to the unbalanced terminal, the second IDT includes first and second IDT sections divided in the surface acoustic wave propagating direction and the first and second IDT sections are respectively electrically connected to the first and second balanced signal terminals, the first to third IDTs are arranged such that a phase of a signal emanating from the unbalanced terminal to the first balanced signal terminal is reversed by about 180 degrees with respect to a phase of a signal emanating from the unbalanced terminal to the second balanced signal terminal, and in an area where the first to third IDTs are adjacent one another in the surface acoustic wave propagating direction with a gap interposed therebetween, a plurality of electrode fingers near the gap correspond to a narrow pitch electrode finger section in which a pitch of the electrode fingers is relatively small, and when an electrode finger pitch of the narrow pitch electrode finger section of the first and third IDTs connected to the unbalanced signal terminal is set as P1, an electrode finger pitch of the narrow pitch electrode finger section of the second IDT whose first and second IDT sections are respectively connected to the first and second balanced signal terminal is set as P2, the number of electrode fingers of the pitch electrode finger section except for the narrow pitch electrode finger section of the first and third IDTs is set as K1, and the number of electrode fingers of the pitch electrode finger section except for the narrow pitch electrode finger section of the second IDT is set as K2, the following relationships:

$P1 > P2$; and $1.12 \leq K1/K2 \leq 1.65$ are satisfied.

A sixth preferred embodiment is a balanced-type surface acoustic wave filter connected to an unbalanced terminal and first and second balanced terminals and provided with a balance-unbalance conversion function, including a piezoelectric substrate, and first to third IDTs arranged in a surface acoustic wave propagating direction on the piezoelectric substrate, wherein the first and third IDTs located on both sides of the second IDT in a surface acoustic wave propagating direction are connected to the unbalanced terminal, the second IDT includes first and second IDT sections divided in the surface acoustic wave propagating direction and the first and second IDT sections are respectively electrically connected to the first and second balanced signal terminals, the first to third IDTs are arranged such that a phase of a signal emanating from the unbalanced terminal to the first balanced signal terminal is reversed by about 180 degrees with respect to a phase of a signal emanating from the unbalanced terminal to the second balanced signal terminal, and in an area where the first to third IDTs are adjacent one another in the surface acoustic wave propagating direction with a gap interposed therebetween, a plurality of electrode fingers near the gap correspond to a narrow pitch electrode finger section where a pitch of the electrode fingers is relatively small, and when an electrode finger pitch of the narrow pitch electrode finger section of the first and third IDTs connected to the unbalanced signal terminal is set as P1, an electrode finger pitch of the narrow pitch electrode finger section of the second IDT whose first and second IDT sections are respectively connected to the first and second balanced signal terminal is set as P2, the number of electrode fingers of the pitch electrode finger section except for the narrow pitch electrode finger section of the first and third IDTs is set as K1, the number of electrode fingers of the pitch electrode finger section except for the narrow pitch electrode finger section of the second IDT is set as K2, the number of electrode fingers of the narrow pitch electrode finger section of the first and third IDTs is set as K1$n$, and the number of electrode fingers of the narrow pitch electrode finger section of the second IDT is set as K2$n$, the following relationships:

$P1>P2;$ $K1n=K2n;$ and $1.12 \leq K1/K2 \leq 1.65$ are satisfied.

In the balanced-type surface acoustic wave filters according to the fifth and sixth preferred embodiments, preferably, when a metallization in the first to third IDTs is set as d and an electrode finger cross width is set as W, $134.8\,\lambda I \leq W/d \leq 148.6\,\lambda I$ (where $\lambda I$ denotes a wavelength of the IDT) is satisfied.

A seventh preferred embodiment is a balanced-type surface acoustic wave filter connected to an unbalanced terminal and first and second balanced terminals and provided with a balance-unbalance conversion function, including a piezoelectric substrate, a first surface acoustic wave filter section including first to third IDTs arranged along a surface acoustic wave propagating direction on the piezoelectric substrate, the second IDT in the center or the first and third IDTs on both sides of the second IDT being connected to the unbalanced terminal, and the first and third IDTs on both sides of the second IDT or the second IDT in the center being connected to the first balanced terminal, and a second surface acoustic wave filter section including first to third IDTs arranged in the surface acoustic wave propagating direction on the piezoelectric substrate, the second IDT in the center or the first and third IDTs on both sides of the second IDT being connected to the unbalanced terminal, the first and third IDTs on both sides of the second IDT or the second IDT in the center being connected to the second balanced terminal, and the second surface acoustic wave filter section being arranged to have a phase of an output signal to an input signal different by about 180 degrees with respect to the first surface acoustic wave filter section, wherein in the first and second surface acoustic wave filter sections, in a pair of IDTs adjacent to each other with a gap interposed therebetween in the surface acoustic wave propagating direction, a section where a cycle of a portion of electrode fingers including an electrode finger facing the gap is less than a cycle of electrode fingers of a main portion of the IDT is set as a narrow pitch electrode finger section, and when an electrode finger pitch of the narrow pitch electrode finger section of the IDT connected to the unbalanced terminal of the first and second surface acoustic wave filter sections is set as P1, the number of electrode fingers of the narrow pitch electrode finger section thereof is set as N1, an electrode finger pitch of the narrow pitch electrode finger section of the IDT connected to the first and second balanced terminals is set as P2, and the number of electrode fingers of the narrow pitch electrode finger section thereof is set as N2, the following relationships:

$P1 \neq P2;$ and $N1<N2$ are satisfied.

An eighth preferred embodiment is a balanced-type surface acoustic wave filter connected to a balanced terminal and first and second unbalanced terminals and provided with a balance-unbalance conversion function, including a piezoelectric substrate, and first to third IDTs arranged in a surface acoustic wave propagating direction on the piezoelectric substrate, wherein the second IDT is connected to the unbalanced terminal, and the first and third IDTs are respectively connected to the first and second balanced terminals, and in an area where the first to third IDTs are adjacent one another, the respective IDTs have narrow pitch electrode finger sections and an electrode finger pitch of the narrow pitch electrode finger section is less than an electrode finger pitch of a main portion of the pitch electrode finger section of the IDT provided with narrow pitch electrode fingers, and a phase of the first IDT is reversed by about 180 degrees with respect to a phase of the third IDT, and when an electrode finger pitch of the narrow pitch electrode finger section of the second IDT connected to the unbalanced terminal is set as P1, the number of electrode fingers of the narrow pitch electrode finger section thereof is set as N1, an electrode finger pitch of the narrow pitch electrode finger section of the first and third IDTs connected to the first and second balanced terminals is set as P2, and the number of electrode fingers of the narrow pitch electrode finger section thereof is set as N2, the following relationships:

$P1 \neq P2;$ and $N1<N2$ are satisfied.

A ninth preferred embodiment is a balanced-type surface acoustic wave filter connected to an unbalanced terminal and first and second balanced terminals and provided with a balance-unbalance conversion function, including a piezoelectric substrate, and first to third IDTs arranged in a surface acoustic wave propagating direction on the piezoelectric substrate, wherein the first and third IDTs located on both sides of the second IDT in the surface acoustic wave propagating direction are connected to the unbalanced terminal, the second IDT includes first and second IDT sections divided in the surface acoustic wave propagating direction and the first and second IDT sections are respectively electrically connected to the first and second balanced signal terminals, the first to third IDTs are arranged such that a phase of a signal emanating from the unbalanced terminal to the first balanced signal terminal reversed by about 180 degrees with respect to a phase of a signal emanating from the unbalanced terminal to the second balanced signal terminal, and in an area where the first to third IDTs are adjacent one another in the surface acoustic wave propagating direction with a gap interposed therebetween, the respective IDTs have narrow pitch electrode finger sections at areas near the gap, and when an electrode finger pitch of the narrow pitch electrode finger section of the first and third IDTs connected to the unbalanced signal terminal is set as P1, the number of electrode fingers of the narrow pitch electrode finger section thereof is set as N1, an electrode finger pitch of the narrow pitch electrode finger section of the second IDT whose first and second IDT sections are respectively connected to the first and second balanced signal terminal is set as P2, and the number of electrode fingers of the narrow pitch electrode finger section thereof is set as N2, the following relationships:

P1≠P2; and

N1<N2 are satisfied.

In the seventh to ninth preferred embodiments, preferably, P1<P2 is satisfied.

The balanced-type surface acoustic wave filters according to the first and second preferred embodiments are provided with the first and second surface acoustic wave filter sections in which the second IDT in the center or the first and third IDTs on both sides of the second IDT are connected to the unbalanced terminal, the first and third IDTs or the second IDT of the first surface acoustic wave filter section are connected to the first balanced terminal and the first and third IDTs or the second IDT of the second surface acoustic wave filter section are connected to the balanced terminal, and the phases of the output signals of the first and second surface acoustic wave filter sections are different by about 180 degrees. Therefore, the balanced-type surface acoustic wave filter provided with the balance-unbalance conversion function is provided.

Then, in the first and second surface acoustic wave filter sections, the pair of IDTs adjacent to each other with a gap interposed therebetween has a narrow pitch electrode finger section where a cycle of a portion of electrode fingers including an electrode finger facing the gap is less than a cycle of electrode fingers of a main portion of the IDT. Then, as P1>P2 and 1.12≦K1/K2≦1.65 are satisfied, it is possible to obtain the surface acoustic wave filter in which the insertion loss and the VSWR in the pass band are small, and not only the filter characteristic having the sufficient band width can be obtained but also the impedance ratio between the unbalanced signal terminal and the balanced signal terminal can be set to 1:2 with certainty.

In particular, as it is possible to change the impedance ratio not only by adjusting the number of electrode fingers of the IDT but also by adjusting the pitch ratio of the narrow pitch electrode finger section, the impedance ratio between the unbalanced signal terminal and the balanced signal terminal can be precisely set to 1:2.

In particular, according to the second preferred embodiment, as K1n=K2n is satisfied, the setting of the narrow pitch electrode finger section is facilitated, and at the same time the effect of suppressing the discontinuity in the area where the IDTs are located adjacent is further enhanced.

In the first and second preferred embodiments, when 67.4 λI≦W/d≦74.3 λI is satisfied, the impedance of the unbalanced terminal can be precisely set to 50 Ω and the impedance of the balanced terminal can be precisely set to 100 Ω, and the balanced-type surface acoustic wave filter connected to the IC of the input impedance of 100 Ω is easily provided.

In the balanced-type surface acoustic wave filters according to the third and fourth preferred embodiments, as the second IDT is connected to the unbalanced terminal, the first and third IDTs on both sides of the second IDT are connected to the first and second balanced terminal, and the phase of the first IDT is reversed by about 180 degrees with respect to the phase of the third IDT, similarly to the first preferred embodiment, the balanced-type surface acoustic wave filter provided with the balance-unbalance conversion function is provided. Then, the first to third IDTs include the narrow pitch electrode finger sections, and P1>P2 and 1.12≦K1/K2≦1.65 are satisfied. Therefore, a surface acoustic wave filter is obtained in which the insertion loss and the VSWR in the pass band are greatly reduced, and not only the filter characteristic having the sufficient band width is obtained, but also the impedance ratio between the unbalanced signal terminal and the balanced signal terminal is reliably set to about 1:2. In particular, as the impedance ratio can be changed not only by adjusting the number of electrode fingers of the IDT, but also by adjusting the pitch ratio of the narrow pitch electrode finger section, the impedance ratio between the unbalanced signal terminal and the balanced signal terminal is precisely set to 1:2.

In particular, according to the fourth preferred embodiment, K1n=K2n is satisfied, and therefore, the designing of the IDT having the narrow pitch electrode finger section is facilitated, and at the same time the effect of suppressing the discontinuity of the area where the IDTs are adjacent due to the provision of the narrow pitch electrode finger section is enhanced.

In the third and fourth preferred embodiments, when 134.8 λI≦W/d≦148.6 λI is satisfied, the impedance of the unbalanced terminal of 50 Ω and the impedance of the balanced terminal of 100 Ω can be precisely set, making it possible to easily provide the balanced-type surface acoustic wave filter connected to the IC of the input impedance of about 100Ω.

According to the fifth and sixth preferred embodiments, as the first to third IDTs are arranged in the surface acoustic wave propagating direction on the piezoelectric substrate, the first and third IDTs are connected to the unbalanced terminal, the second IDT includes the first and second IDT sections divided in the surface acoustic wave propagating direction, the first and second IDT sections are respectively connected to the first and second balanced signal terminals, and the phase of the signal from the unbalanced terminal to the first balanced terminal is reversed by about 180 degrees with respect to the phase of the signal from the unbalanced terminal to the second balanced terminal, similar to the first and second preferred embodiment, the balanced-type surface acoustic wave filter provided with the balance-unbalance conversion function is provided.

Then, in the third preferred embodiment, the first to third IDTs have the narrow pitch electrode finger section in which P1>P2 and 1.12≦K1/K2≦1.65 are satisfied. Therefore, the insertion loss and the VSWR in the pass band of the surface acoustic wave filter are small. In addition, not only are sufficient filter characteristics and sufficient band width obtained, but also the impedance ratio between the unbalanced signal terminal and the balanced signal terminal is set to 1:2. In particular, as the impedance ratio can be changed not only by adjusting the number of electrode fingers of the IDT, but also by adjusting the pitch ratio of the narrow pitch electrode finger section, the impedance ratio between the unbalanced signal terminal and the balanced signal terminal can be precisely set to 1:2.

In particular, according to the sixth preferred embodiment, $K1n=K2n$ is satisfied, and therefore, the designing of the IDT having the narrow pitch electrode finger section is facilitated, and at the same time the effect of the provision of the narrow pitch electrode finger section N, namely, the effect of suppressing the discontinuity of the area where the IDTs are adjacent is further enhanced.

In the fifth and sixth preferred embodiments, when $134.8 \lambda I \leq W/d \leq 148.6 \lambda I$ is satisfied the impedance of the unbalanced terminal can be precisely set to 50 Ω the impedance of the balanced terminal can be precisely set to 100 Ω, and the balanced-type surface acoustic wave filter connected to the IC of the input impedance of 100 Ω is easily provided.

According to the seventh preferred embodiment, the first and second surface acoustic wave filter sections including the first to third IDTs on the piezoelectric substrate are provided, the second IDT in the center or the first and third IDTs on both sides of the second IDT of the first and second surface acoustic wave filter sections are connected to the unbalanced signal terminal and the first and third IDTs on both sides of the second IDT or the second IDT of the first surface acoustic wave filter section is connected to the first balanced signal terminal, the first and third IDTs on both sides of the second IDT or the second IDT of the second surface acoustic wave filter section is connected to the second balanced signal terminal, and the pair of IDTs adjacent in the surface acoustic wave propagating direction have a narrow pitch electrode finger section where a cycle of a portion of electrode fingers including an electrode finger facing the gap is less than a cycle of electrode fingers of a main portion of the IDT. In the balanced-type surface acoustic wave filter provided with the balance-unbalance conversion function, $P1 \neq P2$ and $N1 < N2$ are satisfied, and therefore, it is possible to increase the degree of freedom for adjusting impedances of the respective resonant modes. Therefore, the impedance ratio between the unbalanced signal terminal and the balanced signal terminal can be easily set to 1:2 without degrading the film characteristic.

Thus, a surface acoustic wave filter in which the insertion loss and the VSWR in the pass band are small, and not only sufficient filter characteristics having a sufficient band width are obtained, but also, the impedance ratio between the unbalanced signal terminal and the balanced signal terminal can be precisely set to 1:2.

In particular, the impedance ratio can be changed not only by adjusting the number of electrode fingers of the IDT but also by adjusting the pitch ratio of the narrow pitch electrode finger section, and the impedance ratio between the unbalanced signal terminal and the balanced signal terminal can be precisely set to 1:2.

According to the eighth preferred embodiment, in the balanced-type surface acoustic wave filter provided with the balance-unbalance conversion function in which the first to third IDTs are arranged on the piezoelectric substrate, the second IDT is connected to the unbalanced signal terminal, the first and third IDTs on both sides of the second IDT are connected to the first and second balanced signal terminals, and the first to third IDTs have the narrow pitch electrode finger section in which $P1 \neq P2$ and $N1 < N2$ are satisfied, and therefore it is possible to obtain the surface acoustic wave filter in which the insertion loss and the VSWR in the pass band are small. In addition, not only are the sufficient filter characteristics having the sufficient band width obtained, but also, the insertion loss and the VSWR in the pass band are small.

In particular, the impedance ratio can be changed not only by adjusting the number of electrode fingers of the IDT, but also, by adjusting the pitch ratio of the narrow pitch electrode finger section, and the impedance ratio between the unbalanced signal terminal and the balanced signal terminal can be set to 1:2.

According to the ninth preferred embodiment, in the balanced-type surface acoustic wave filter provided with the balance-unbalance conversion function in which the first to third IDTs are arranged in the surface acoustic wave propagating direction on the piezoelectric substrate, the first and third IDTs are connected to the unbalanced signal terminal, the second IDT is divided into the first and second IDT sections, the first and second IDT sections are respectively connected to the first and second balanced signal terminals, and the first to third IDTs have the narrow pitch electrode finger section, in which $P1 \neq P2$ and $N1 < N2$ are satisfied. Therefore, a surface acoustic wave filter in which the insertion loss and the VSWR in the pass band are small is obtained. In addition, not only can the sufficient filter characteristics having the sufficient band width be obtained, but also, the impedance ratio between the unbalanced signal terminal and the balanced signal terminal can be precisely set to 1:2.

In particular, the impedance ratio can be changed not only by adjusting the number of electrode fingers of the IDT, but also, by adjusting the pitch ratio of the narrow pitch electrode finger section. Thus, the impedance ratio between the unbalanced signal terminal and the balanced signal terminal can be precisely set to 1:2.

In the seventh to ninth preferred embodiments, preferably, $P1 < P2$ is satisfied, and in that case, the VSWR in the pass band can be further reduced, whereby it is possible to obtain even more satisfactory filter characteristics.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 15A and 15B are diagrams for describing an effective current distribution of each of the resonant modes shown in FIG. 14, in which FIG. 15A is a schematic construction diagram of the IDT and FIG. 15B is a graph showing each of the resonant modes corresponding to a position of the IDT.

DETAILED DESCRIPTION OF PREFERRED EMBODIMENTS

Hereinafter, with reference to the drawings, the present invention will be made apparent by describing specific preferred embodiments of the present invention.

Figure 1:
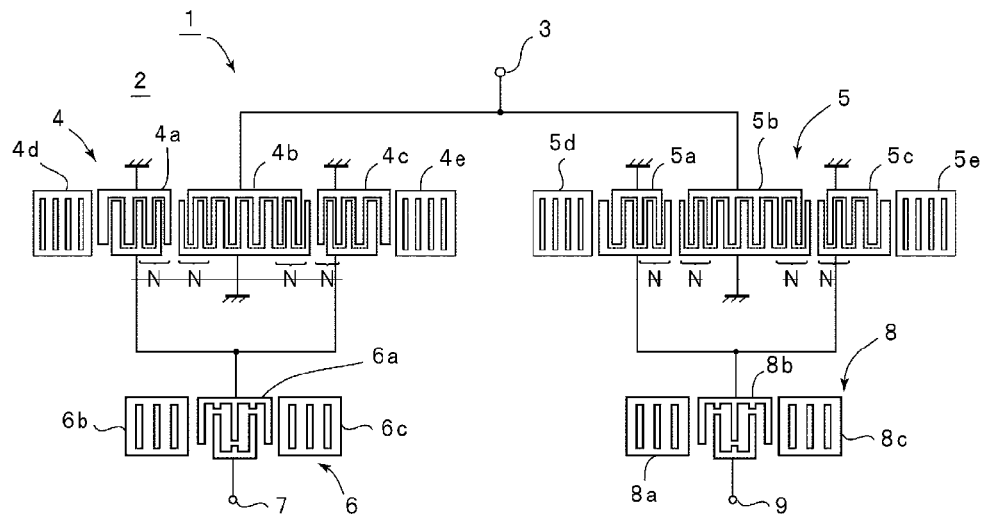
FIG. 1 is a schematic plan diagram showing an electrode construction of a balanced-type surface acoustic wave filter according to a first preferred embodiment of the present invention.

FIG. 1 is a schematic plan diagram showing an electrode construction of a balanced-type surface acoustic wave filter according to a first preferred embodiment of the present invention.

In a balanced-type surface acoustic wave filter 1, an electrode construction as shown is provided on a piezoelectric substrate 2.

In the balanced-type surface acoustic wave filter 1, first and second longitudinally coupled resonator type surface acoustic wave filter sections 4 and 5 are connected to an unbalanced input terminal 3.

The first longitudinally coupled resonator type surface acoustic wave filter section 4 includes three IDTs 4a to 4c which are arranged along the surface acoustic wave propagating direction and reflectors 4d and 4e which are arranged on both sides in the surface acoustic wave propagating direction of the area where the IDTs 4a to 4c are arranged. The first to third IDTs 4a to 4c include narrow pitch electrode finger sections N. That is, by taking the IDTs 4a and 4b as an example, the IDTs 4a and 4b are adjacent to each other with a gap interposed therebetween. The pitch of a plurality of electrode fingers including electrode fingers facing the gap in the IDTs 4a and 4b is narrower than an electrode finger pitch of the remaining main portion electrode finger section of the IDTs 4a and 4b. An electrode finger section with this relatively small electrode finger pitch is a narrow pitch electrode finger section N.

Similarly, in an area where the IDTs 4b and 4c are adjacent to each other, the IDTs 4b and 4c include the narrow pitch electrode finger sections N. With the narrow pitch electrode finger sections N, the discontinuity of the area where a pair of the IDTs are adjacent to each other with a gap interposed therebetween and the gap between the IDTs are adjusted, making it possible to obtain a band pass filter with a wider band width. The effect of such a narrow pitch electrode finger section is known as described in, for example, Patent Document 4 described above.

The longitudinally coupled resonator type surface acoustic wave filter section 5 also includes the first to third IDTs 5a to 5c and the reflectors 5d and 5e. The IDT 5a to 5c also include the narrow pitch electrode finger sections N.

The second IDT 4b and 5b located in the center of the surface acoustic wave filter sections 4 and 5 are electrically connected to the unbalanced input terminal 3. The other ends of the IDTs 4b and 5b are connected to a ground potential.

In the surface acoustic wave filter section 4, the first and third IDTs 4a and 4c located on both sides of the second IDT 4b are electrically connected to a first balanced output terminal 7 via a 1-port type surface acoustic wave resonator 6.

In the same manner, in the surface acoustic wave filter section 5, the second IDT in the center 5b is connected to the unbalanced input terminal 3. The first and third IDTs 5a and 5c located on both sides of the IDT 5b are electrically connected to a second balanced output terminals 9 via a 1-port type surface acoustic wave resonator 8. The first longitudinally coupled resonator type surface acoustic wave filter section 4 and the second longitudinally coupled resonator type surface acoustic wave filter section 5 have the same configuration except that the phase of the output signal is different by about 180 degrees from the input signal.

As described above, the IDTs 5a and 5c are reversed in phase by about 180 degrees with respect to the IDTs 4a and 4c of the first surface acoustic wave filter section 4. Therefore, the signal emanating from the first balanced output terminal 7 and the signal emanating from the second balanced output terminal 9 are reversed in phase by about 180 degrees. Thus, according to this preferred embodiment, the balanced-type surface acoustic wave filter 1 including the unbalanced input terminal 3 and the first and second balanced output terminals 7 and 9 is provided.

The 1-port type surface acoustic wave resonators 6 and 8 have the same electrode configuration.

The reason for the connection of the 1-port type surface acoustic wave resonator 6 is that the attenuation in the neighborhood of the pass band can be increased and the steepness of the filter characteristic can be increased. Then, with the connection of the 1-port type surface acoustic wave resonators 6 and 8, it is possible to adjust the impedances of a plurality of resonant modes in the pass band described below. However, the surface acoustic wave resonators 6 and 8 may not be provided.

It should be noted that the 1-port type surface acoustic wave resonators 6 and 8 may be configured so as not to include reflectors.

The electrode finger pitch of the narrow pitch electrode finger section N of the second IDT 4b and 5b in the first and second surface acoustic wave filter sections 4 and 5 is P1, and the electrode finger pitch of the narrow pitch electrode finger section N of the first and third IDTs 4a, 4c, 5a, and 5c is P2. Then, the number of electrode fingers of the electrode finger section except for the narrow pitch electrode finger section of the respective second IDTs 4b and 5b is K1 and the number of electrode fingers of the electrode finger section except for the narrow pitch electrode finger section of the first and third IDTs is K2.

Furthermore, the number of electrode fingers of the narrow pitch electrode finger section of the first and second surface acoustic wave sections 4 and 5 is K1n, and the number of electrode fingers of the narrow pitch electrode finger section of the first and third IDTs 4a, 4c, 5a, and 5c is K2n.

In this preferred embodiment P1>P2, K1n=K2n and $1.12 \leq K1/K2 \leq 1.65$. Accordingly, the filter characteristic are not substantially influenced, and it is possible to easily change the impedance ratio of the unbalanced input terminal 3 and the balanced output terminals 7 and 9. In particular, the impedance ratio can be changed not only by adjusting the number of electrode fingers of the IDT, but also, by adjusting the pitch ratio of the narrow pitch electrode finger section N. Thus, the impedance ratio between the unbalanced signal terminal and the balanced signal terminal can be precisely set, for example, to 1:2.

In particular, when the metallization ratio between the first and second surface acoustic wave sections 4 and 5 is set as d and an electrode finger cross width is set as W, where $67.4 \lambda I \leq W/d \leq 74.3 \lambda I$ (where $\lambda I$ denotes a wavelength of the IDT) is satisfied, it is easy to set the impedance on the unbalanced input terminal 3 side to about 50 Ω and the impedance on sides of the balanced output terminals 7 and 9 sides to about 100 Ω. This will be described in more detail with reference to specific examples.

It should be noted that, to simplify the drawings, the number of electrode fingers of the IDTs and the reflectors shown in the figures is less than the actual number of electrode fingers.

The surface acoustic wave filter 1 is manufactured by the following method.

An electrode finger cross width of the longitudinally coupled resonator type surface acoustic wave filter section is set to about 51.0 $\lambda I$. $\lambda$ denotes an electrode finger pitch except for the narrow pitch electrode finger section of the IDT. In the IDTs 4a to 4c, the electrode finger cross widths are set to be equal to each other.

The number of electrode fingers of the IDT 4a is set to 22 (3), the number of electrode fingers of the IDT 4b is set to (3) 31 (3), and the number of electrode fingers of the IDT 4c is set to (3) 22. It should be noted that the number of electrode fingers in parentheses represents the number of electrode fingers of one narrow pitch electrode finger section N and the number of electrode fingers outside the parentheses represents the number of electrode fingers except for the narrow pitch electrode finger section N.

The number of the electrode fingers of the respective reflectors 4d and 4e: 85.

The metallization ratio in the IDTs 4a to 4c and the reflectors 4d and 4e: about 0.72 except for the narrow pitch electrode finger section and about 0.68 in the narrow pitch electrode finger section N.

The electrode film thickness=0.092 $\lambda I$.

It should be noted that the surface acoustic wave filter section 5 is designed in the same manner as described above, except that directions of the IDTs 5a and 5c are reversed with respect to those of the IDTs 4a and 4c.

Specification of the 1-port type surface acoustic wave resonator 6.

The electrode finger cross width: 23.8 $\lambda I$ (where $\lambda I$ denotes a wavelength defined by the electrode finger pitch of the IDT 6a).

The number of electrode fingers of the IDT: 161.

The number of electrode fingers of the respective reflectors 6a and 6c: 15.

The metallization ratio: 0.60.

The electrode film thickness: 0.095 $\lambda I$.

It should be noted that a 40±5 degree Y-cut X-propagating LiTaO$_3$ substrate is preferably used as the piezoelectric substrate 2 and the above-mentioned respective electrodes are preferably formed of Al. In this manner, a DCS reception filter is obtained in which the unbalanced input terminal 3 having the input impedance of about 50 Ω and the balanced output terminals 7 and 9 having the impedance of about 100Ω.

Figure 2:
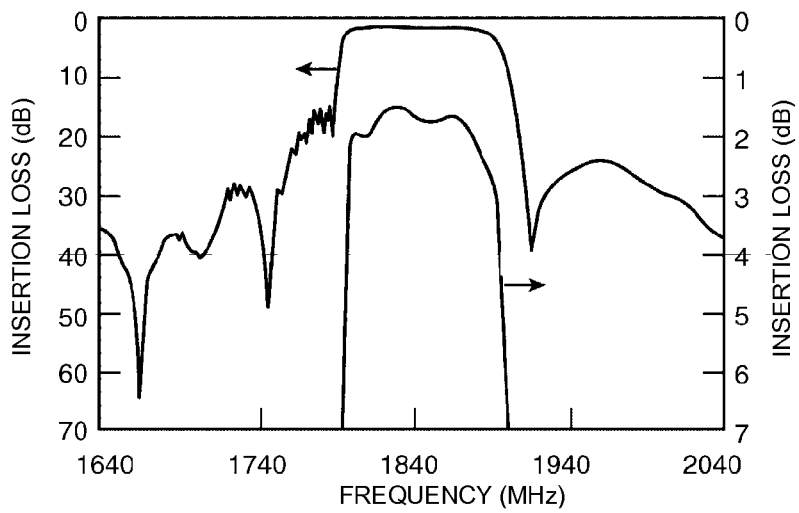
FIG. 2 is a graph showing an attenuation-frequency characteristic of the surface acoustic wave filter according to the first preferred embodiment of the present invention.
Figure 3:
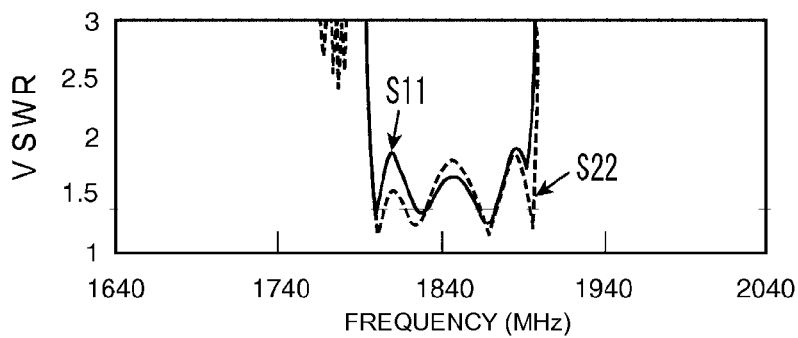
FIG. 3 is a graph showing a VSWR characteristic of the surface acoustic wave filter according to the first preferred embodiment of the present invention.
Figure 4A:
FIGS. 4A and 4B are Smith charts showing reflection characteristics of S1 and S2 of the surface acoustic wave filter according to the first preferred embodiment of the present invention.
Figure 4B:
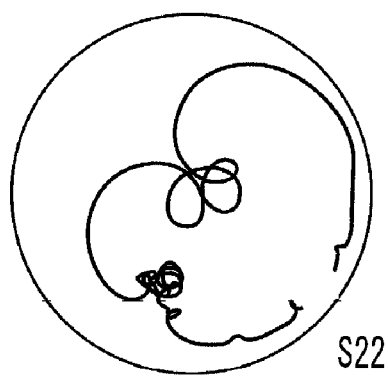

Characteristics of the surface acoustic wave filter 1 designed as described above are shown in FIGS. 2 to 4. FIG. 2 shows an attenuation frequency characteristic of the surface acoustic wave filter 1. Then, FIG. 3 shows a VSWR characteristic of the surface acoustic wave filter 1. FIGS. 4A and 4B are Smith charts showing a reflection characteristic of S11 on the unbalanced signal terminal and a reflection characteristic of S22 on the balanced signal terminal. It should be noted that in the drawings attached to this specification, hereinafter, the reflection characteristic on the unbalanced signal terminal of the surface acoustic wave filter is S11 and the reflection characteristic on the balanced signal terminal is S22.

One feature of this preferred embodiment is that an electrode finger pitch P1 of the narrow pitch electrode finger section N of the IDTs 4b and 5b connected to the unbalanced input terminal 3 and an electrode finger pitch P2 of the narrow pitch electrode finger section N of the IDTs 4a, 4c, 5a, and 5c connected to and the balanced output terminals 7 and 9 are different from each other. That is, when a wavelength defined by the electrode finger pitch of the main portion of the electrode finger section except for the narrow pitch electrode finger section N of the IDTs 4a to 4c and 5a to 5c is λI, the electrode finger pitch P1 of the narrow pitch electrode finger section N of the second IDT 4b and 5b is about 0.454 λI and the pitch P2 of the narrow pitch electrode finger section of the first and third IDTs 4a, 4c, 5a, and 5c is about 0.438 λI. Therefore, the electrode finger pitch P1 of the narrow pitch electrode finger section N in the IDTs 4b and 5b connected to the unbalanced input terminal 3 is set to be greater than the electrode finger pitch of the narrow pitch electrode finger section P2 in the IDTs 4a, 4c, 5a, and 5c connected to the balanced output terminals 7 and 9.

Figure 5:
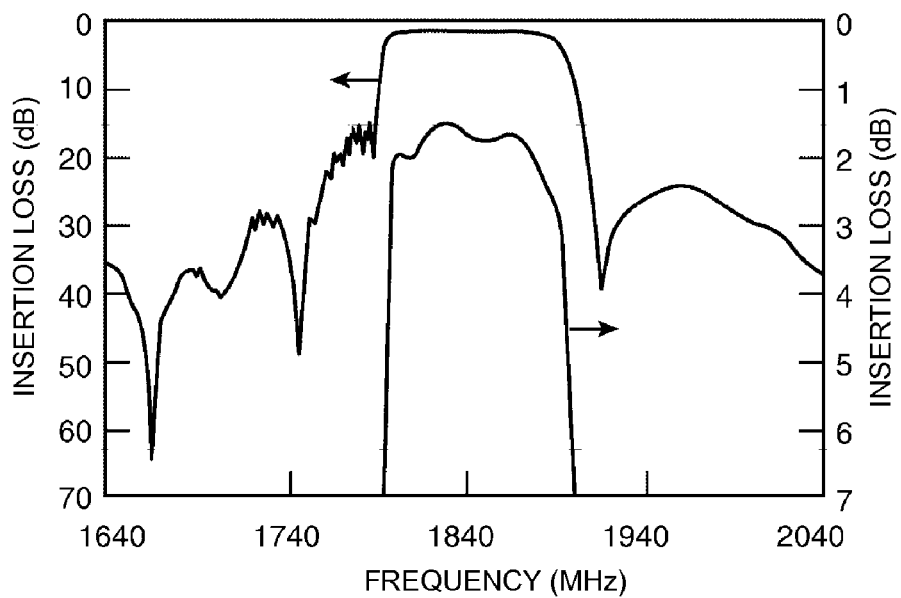
FIG. 5 is a graph showing an attenuation-frequency characteristic of a narrow pitch electrode finger section of the surface acoustic wave filter in which electrode finger pitches are set equal to each other prepared for comparison.
Figure 6:
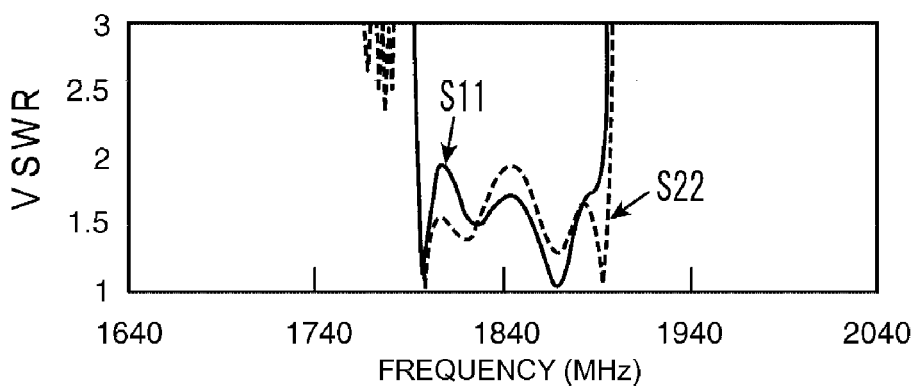
FIG. 6 is a graph showing a VSWR-frequency characteristic of the surface acoustic wave filter in which electrode finger pitches are set equal to each other prepared for comparison.
Figure 7A:
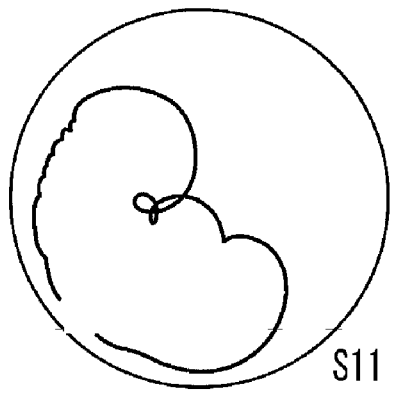
FIGS. 7A and 7B are Smith charts showing reflection characteristics of S11 and S22 of the surface acoustic wave filter in which electrode finger pitches are set equal to each other prepared for comparison.
Figure 7B:
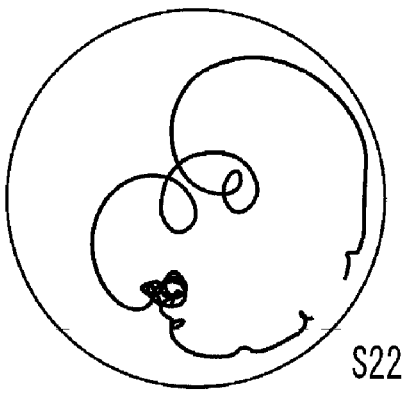

FIGS. 5 to 7 show the filter characteristic of a balanced-type surface acoustic wave filter that is constructed similarly to the balanced-type surface acoustic wave filter 1 of the above-mentioned preferred embodiment, except that the electrode finger pitches of all of the narrow pitch electrode finger sections N are set to about 0.447 λI for comparison. FIG. 5 shows an attenuation frequency characteristic of the above-described surface acoustic wave filter prepared for comparison and FIG. 6 shows a VSWR characteristic. FIGS. 7A and 7B show reflection characteristics S11 and S22, respectively.

It should be noted that the pass band for the DCS reception filter is 1805 MHz to 1880 MHz. As is apparent from the comparison of FIGS. 2 and 3 with FIGS. 5 and 6, in the surface acoustic wave filter prepared for comparison, the above-mentioned maximum insertion loss in the pass band is about 2.16 dB and the maximum value of the VSWR is about 2.00, whereas in the surface acoustic wave filter 1 according to the above-mentioned preferred embodiment, the maximum insertion loss in the pass band is reduced to about 2.13 dB and the maximum value of the VSWR in the pass band is also reduced to about 1.83. Therefore, according to this preferred embodiment, the maximum insertion loss in the pass band is improved by about 0.15 dB and the VSWR is improved by about 0.20.

In this preferred embodiment, the reason why the insertion loss and the VSWR in the pass band is improved will be described with reference to FIGS. 8A to 13B.

Figure 8A:
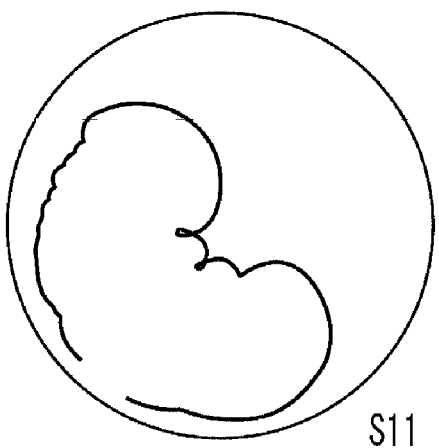
FIGS. 8A and 8B are Smith charts showing reflection characteristics of S11 and S22 of the surface acoustic wave filter designed to set the impedance of the unbalanced signal terminal to 50 Ω and set the impedance of the balanced signal terminal to 150Ω.
Figure 8B:
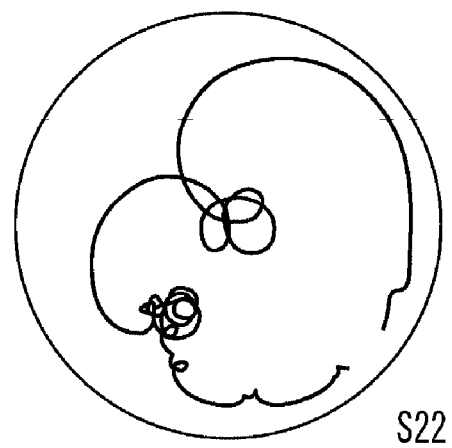

First of all, FIGS. 8A and 8B show the reflection characteristics S11 and S22 obtained when the surface acoustic wave filter is designed such that the impedance of the unbalanced input terminal 3 is set to about 50 Ω and the balanced output terminals 7 and 9 is set to about 150 Ω in the electrode configuration shown in FIG. 1. Design parameters are as follows.

The electrode finger cross width of the surface acoustic wave filter=41.7 λI.

The number of electrode fingers of the IDT 4a: 20 (3), the number of electrode fingers of the IDT 4b: (3) 33 (3), and the number of electrode fingers of the IDT 4c corresponds to (3) 20.

The number of electrode fingers of the reflectors: 85.

The metallization ratio: 0.72 (the metallization ratio of the narrow pitch electrode finger section is set to 0.68).

The electrode film thickness: 0.092 λI.

The electrode finger pitch of the narrow pitch electrode finger section N: 0.444 λI.

Figure 9A:
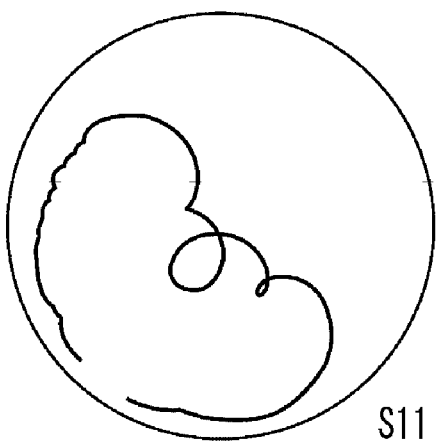
FIGS. 9A and 9B are Smith charts showing reflection characteristics of S11 and S22 obtained when the impedance of the unbalanced signal terminal is set to 50 Ω and the impedance of the balanced signal terminal is set to 100Ω.
Figure 9B:
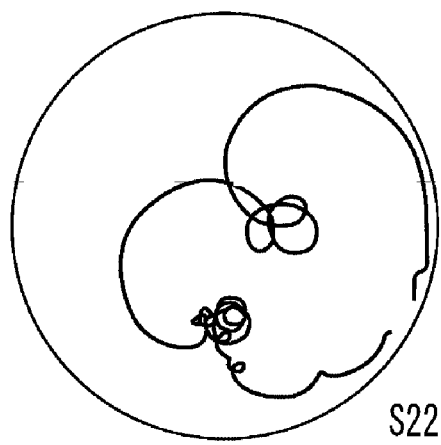

FIGS. 9A and 9B show the reflection characteristics S11 and S22 obtained when the impedance of the unbalanced input terminal is set to about 50 Ω and the impedance of the balanced output terminals is set to about 100 Ω. As is apparent from FIGS. 9A and 9B, the impedance of the S22 side is substantially shifted from 100 Ω, which is the matching point.

Figure 10A:
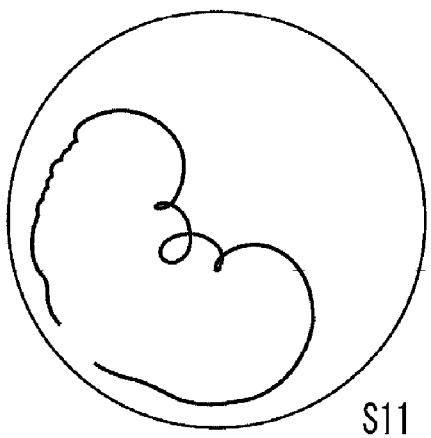
FIGS. 10A and 10B are Smith charts showing reflection characteristics on the S11 side and the S22 side obtained when the electrode finger cross width of the surface acoustic wave filter is changed to 51.0 λI.
Figure 10B:
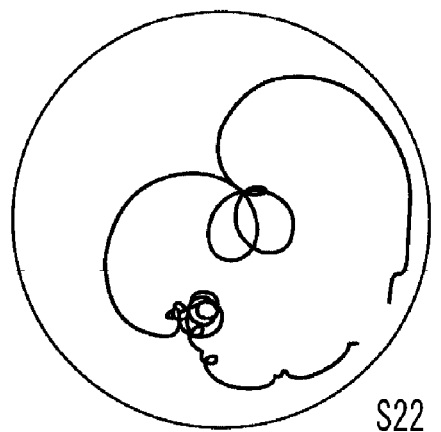

Next, FIGS. 10A and 10B show characteristics obtained when the electrode finger cross width of the first and second longitudinally coupled resonator type surface acoustic wave filter sections 4 and 5 is changed from about 41.7 λI to about 751.0 λI. At this time, the impedance of the S22 side is about 100 Ω. However, the impedance on the S11 side is substantially shifted from 50 Ω, which is the matching point.

Figure 11A:
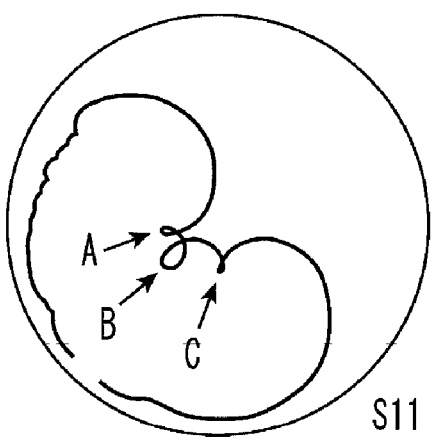
FIGS. 11A and 11B are Smith charts showing reflection characteristics on the S11 side and the S22 side obtained when the electrode fingers of the IDT are changed to set the impedance on the S11 side high and set the impedance of the S22 side low.
Figure 11B:
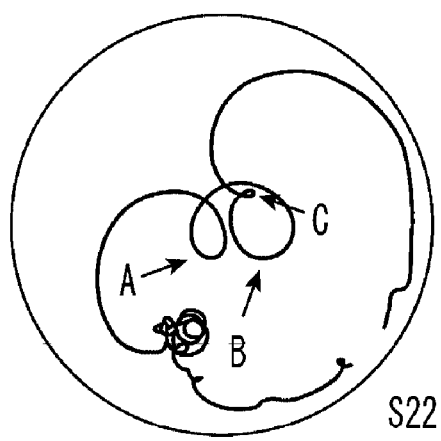
Figure 12A:
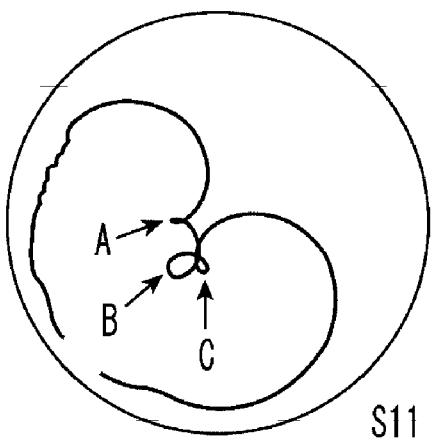
FIGS. 12A and 12B are Smith charts showing reflection characteristics on the S11 side and the S22 side obtained when the electrode finger pitch of the narrow pitch electrode finger section of the IDT is changed from 0.444 λI to 0.438 λI.
Figure 12B:
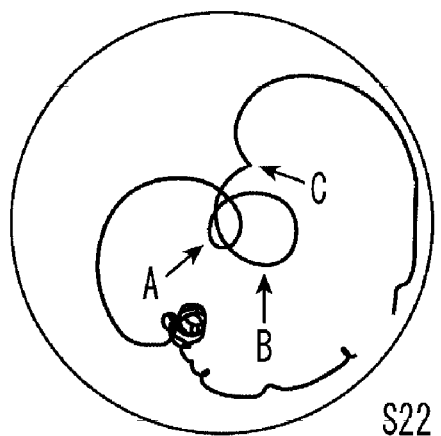

Next, in order for the impedance on the S11 side to be high and at the same time the impedance of the S22 side to be low, the number of electrode fingers the IDTs 4b and 5b is set to a low number and the number of electrode fingers of the IDTs 4a, 4c, 5a, and 5c is set to a large number. That is, the construction is changed from 20 (3)/(3) 33 (3)/(3) 20 to 22 (3)/(3) 31 (3)/(3) 22. FIGS. 11A and 11B show the reflection characteristics of the surface acoustic wave filter that is changed as described above. As is apparent from FIGS. 11A and 11B, in this case, among three resonances A to C defining the pass band of the longitudinally coupled resonator type surface acoustic wave filter section, the impedance of the resonance A is high on the S11 side as desired and low on the S22 side. However, it is understood that the impedances of the resonances B and C are not substantially changed.

Figure 14:
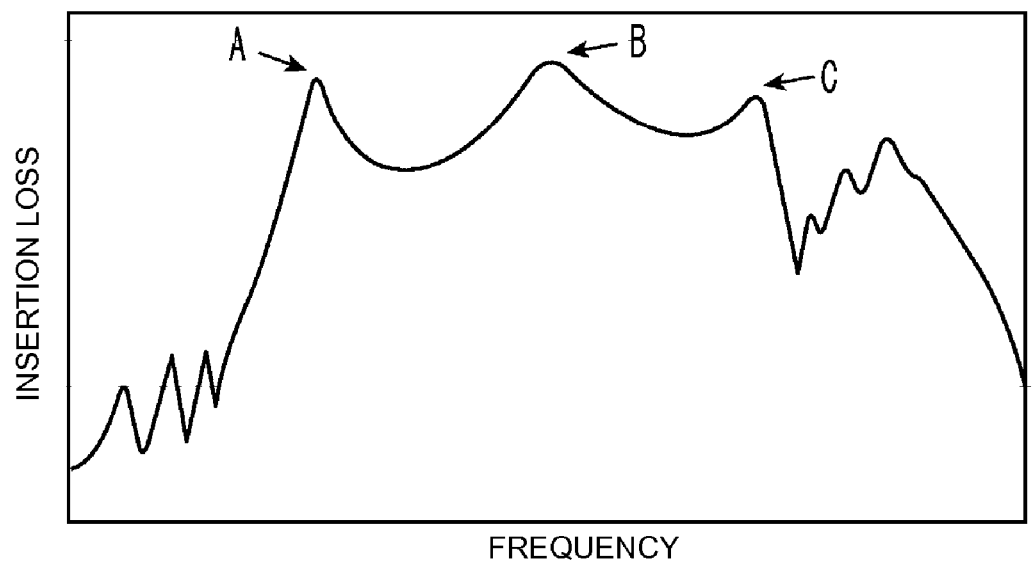
FIG. 14 is a graph for describing three resonant modes appearing in the balanced-type surface acoustic wave filter.
Figure 15A:
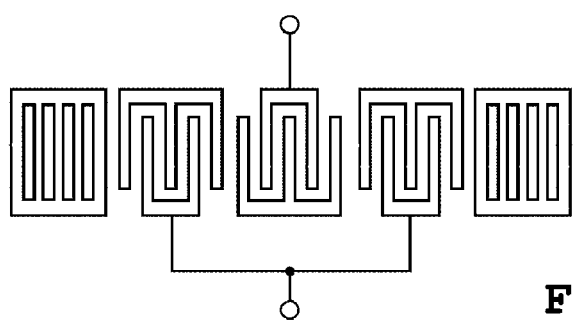
Figure 15B:
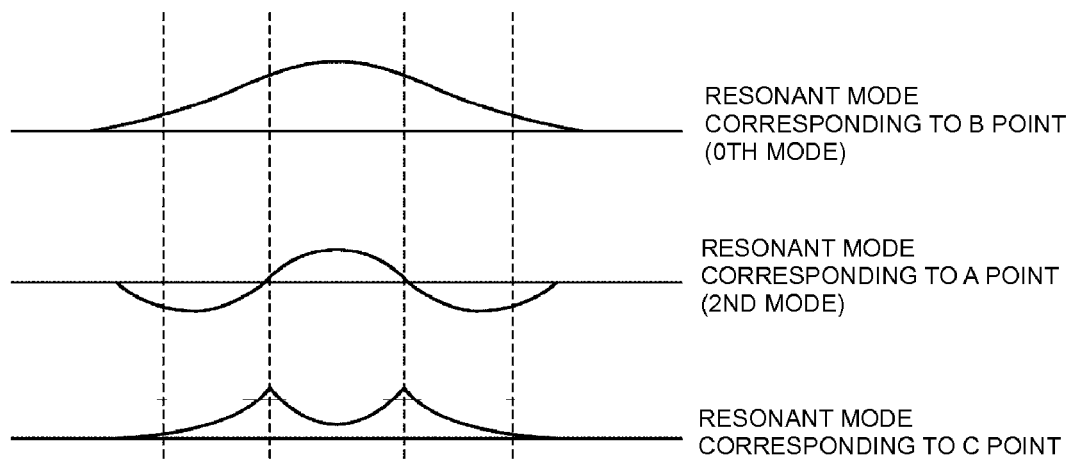

It should be noted that the above-mentioned resonances A to C refer to three resonances A to C defining the pass band of the longitudinally coupled resonator type surface acoustic wave filter section as shown in FIGS. 14 and 15. Here, the resonance A, the resonance B, and the resonance c appear in the ascending order of the frequencies, and as is apparent from FIG. 15, the resonance A is the 2nd mode resonance and the resonance B is the 0th mode resonance.

Next, FIGS. 11A and 11B and FIGS. 12A and 12B show characteristics obtained when the electrode finger pitch of the narrow pitch electrode finger section N of the IDTs 4a and 4c, and 5a and 5c is changed to about 0.438 λI. That is, the electrode finger pitch of the narrow pitch electrode finger section is changed from about 0.444 λI to about 0.438 λI. As a result, as is apparent from FIG. 12A, a concentration ratio of the resonances A to C on the S11 side, that is, a concentration ratio of the impedance is improved. However, at the same time, the impedance of the resonance B on the S11 side is too capacitive, and furthermore, the resonance C on the S22 side is too inductive.

Figure 13A:
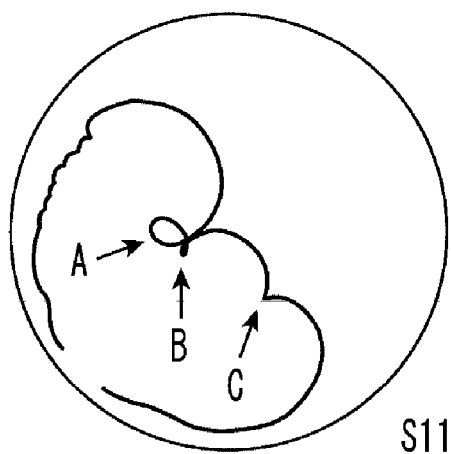
FIGS. 13A and 13B are Smith charts showing reflection characteristics on the S11 side and the S22 side obtained when the electrode finger pitch of the narrow pitch electrode finger section of the second IDT in the center is changed from 0.444 λI to 0.454 λI.
Figure 13B:
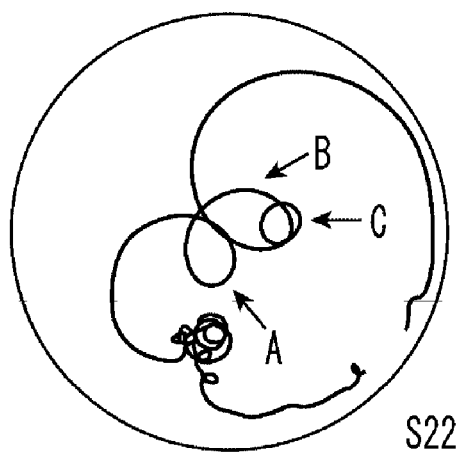

Next, FIGS. 13A and 13B show characteristics obtained when the electrode finger pitch of the narrow pitch electrode finger section N of the IDTs 4b and 5b is changed to about 0.454 λI. That is, FIGS. 13A and 13B show characteristics obtained when the electrode finger pitch of the narrow pitch electrode finger section N is changed from about 0.444 λI to about 0.454 λI. In this case, in contract to where the electrode finger pitch of the narrow pitch electrode finger section P2 of the IDTs 4a and 4c, and 5a and 5c is set small, although the concentration ratio of the impedance on the S11 side is degraded, the impedance of the resonance B on the S11 side is inductive and that of the resonance C on the S22 side is capacitive. That is, when the electrode finger pitch P2 of the narrow pitch electrode finger section N of the IDTs 4a, 4c, 5a, and 5c connected to the balanced output terminals 7 and 9 is set to be small, by increasing the electrode finger pitch P1 of the narrow pitch electrode finger section N of the IDTs 4b and 5b, the respective detriments are compensated for. Therefore, with this construction, in the balanced-type surface acoustic wave filter according to the first preferred embodiment described above, as shown in FIGS. 4A and 4B, the impedance ratio between the impedance of the balanced input terminal 3 and the balanced output terminals 7 and 9 is adjusted, the degradation in the filter characteristic is effectively suppressed.

Figure 16:
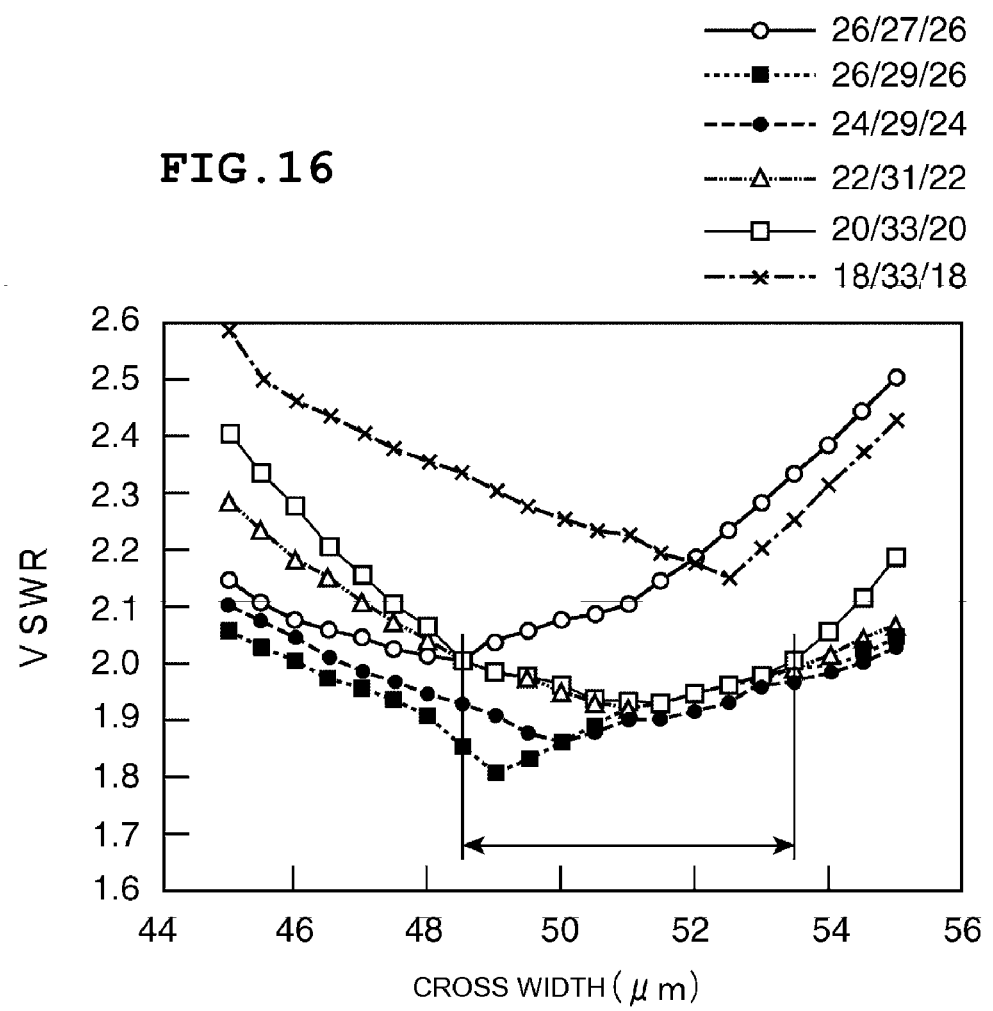
FIG. 16 is a graph showing changes in the VSWR when the electrode finger cross width and the number of electrode fingers of the electrode finger section of the IDT are changed.

Next, in the surface acoustic wave filter 1 configured to satisfy P1>P2, when the impedance ratio between the unbalanced input terminal 3 and the balanced output terminals 7 and 9 is set to about 1:2, the number and the cross width of the electrode fingers of the IDT for obtaining a satisfactory electric characteristic are examined. The result is shown in FIG. 16.

That is, the number of electrode fingers of the IDTs except for the electrode fingers of the narrow pitch electrode finger section, for example in the IDTs 4a to 4c of the above-mentioned preferred embodiment corresponds to 22/31/22. The number of electrode fingers of the IDTs 4a to 4c except for the electrode fingers of the narrow pitch electrode finger section is adjusted and the electrode finger cross width is adjusted to fabricate various types of the surface acoustic wave filter 1 for measuring the VSWR. It should be noted that the IDTs 5a to 5c are similar to the IDTs 4a to 4c.

As is apparent from FIG. 16, the VSWR reduced to less than the value of the VSWR of 2.0 in the related-art balanced-type surface acoustic wave filter, and the range of the improvement is disclosed below. It should be noted that hereinafter K1 denotes the number of electrode fingers of the electrode finger section except for the electrode fingers of the narrow pitch electrode finger section N in the second IDTs 4b and 5b in the center and K2 denotes the number of electrode fingers of the electrode finger section except for the electrode fingers of the narrow pitch electrode finger section N in the first and third IDTs 4a, 4c, 5a, and 5c.

| IDT finger number | K1/K2 | Cross width W range |
| --- | --- | --- |
| 26/29/26 | 1.12 | 46.0 to 54.0 λI |
| 24/29/24 | 1.21 | 46.5 to 54.5 λI |
| 22/31/22 | 1.41 | 48.5 to 54.5 λI |
| 20/33/20 | 1.65 | 48.5 to 53.5 λI |

That is, when P1>P2 and $1.12 \leq K1/K2 \leq 1.65$ are satisfied, and when the electrode finger cross width is set in the range of $48.5 \text{ λI} \leq W \leq 53.5 \text{ λI}$, acceptable film characteristics are obtained.

However, as is known, when the metallization ratio is changed, the capacity is changed and the optimal value of the electrode finger cross width is changed. Thus, when a metallization ratio of electrode fingers except for the narrow pitch electrode finger section N is set as d, it is desirable to set the value of the electrode finger cross width W in the range of $67.4 \text{ λI} \leq W/d \leq 74.3 \text{ λI}$. In this manner, the balanced-type surface acoustic wave filter 1 connected to the IC with the input impedance of 100 Ω and provided with the acceptable film characteristics is easily provided in which the impedance of the unbalanced input terminal 3 can be precisely set to 50 Ω and the impedances of the balanced output terminals 7 and 9 can be precisely set to 100Ω.

In particular, in the above-described preferred embodiment, not only the number of the electrode fingers, that is, the number of electrode fingers, but also the electrode finger pitches P1 and P2 of the narrow pitch electrode finger sections are changed, and therefore the impedance ratio between the impedance of the unbalanced input terminal 3 and the impedances of the balanced output terminals 7 and 9 can be precisely set to about 1:2.

It should be noted that although K1n=K2n is satisfied in this preferred embodiment, the number of electrode fingers K1n of the narrow pitch electrode finger section of the second IDT 4b and 5b connected to the unbalanced signal terminal should not necessarily be equal to the number of electrode fingers K2n of the narrow pitch electrode finger section of the first and second IDTs 4a, 4c, 5a, and 5c connected to the balanced signal terminal. However, as described above, with the setting of K1n=K2n, the design of the IDT is facilitated, and at the same time, the effect provided by the narrow pitch electrode finger section of suppressing the discontinuity in the area where the IDTs are located adjacent is further enhanced.

Second Preferred Embodiment

A balanced-type surface acoustic wave filter having the same electrode configuration as the balanced-type surface acoustic wave filter 1 of the first preferred embodiment is fabricated. It should be noted that the electrode configuration is preferably the same as that of the first preferred embodiment, and, hereinafter, reference numerals of the respective components of the surface acoustic wave filter according to the second preferred embodiment are the same as in the case of the surface acoustic wave filter 1.

The configuration of the surface acoustic wave filter according to the second preferred embodiment is preferably the same as that of the surface acoustic wave filter according to the first preferred embodiment except for the following three points.

(1) The number of the electrode fingers of the IDTs 4a to 4c and 5a to 5c: 22 (5)/(3) 31 (3)/(5) 22, where the number of electrode fingers in brackets represents the number of electrode fingers of one narrow pitch electrode finger section and the number of electrode fingers outside the brackets represents the number of electrode fingers of the IDT except for the narrow pitch electrode finger section. The number of electrode fingers of the IDTs 5z to 5c is equal to that of the IDTs 4a to 4c.

(2) The pitch P1 of the narrow pitch electrode finger section N of the second IDT 4b and 5b=0.437 λI (3) The electrode finger pitch P2 of the narrow pitch electrode finger section N of the first and third IDTs 4a, 4c, 5a, and 5c=0.462 λI That is, the number of electrode fingers N2 of the narrow pitch electrode finger section N of the IDTs 4a and 4c, 5a, and 5c connected to the balanced output terminals 7 and 9 is greater than the number of electrode fingers N1 of the narrow pitch electrode finger section N of the IDTs 4b and 5b connected to the unbalanced input terminal 3, and at the same time, the electrode finger pitch P2 is greater than the electrode finger pitch P1.

Figure 17:
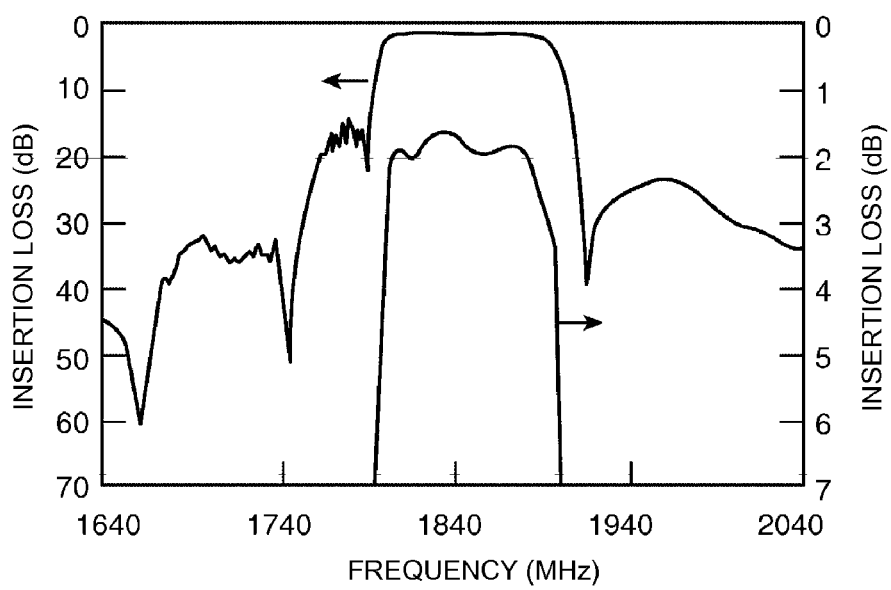
FIG. 17 is a graph showing an attenuation-frequency characteristic of the surface acoustic wave filter according to a second preferred embodiment of the present invention.
Figure 18:
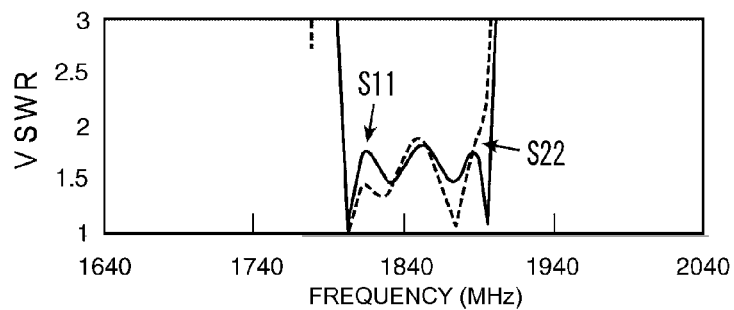
FIG. 18 is a graph showing the VSWR characteristic of the surface acoustic wave filter according to the second preferred embodiment of the present invention.
Figure 19A:
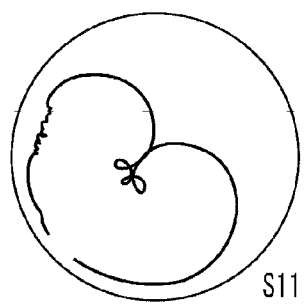
FIGS. 19A and 19B are Smith charts showing reflection characteristics on the S11 side and the S22 side in the surface acoustic wave filter according to the second preferred embodiment of the present invention.
Figure 19B:
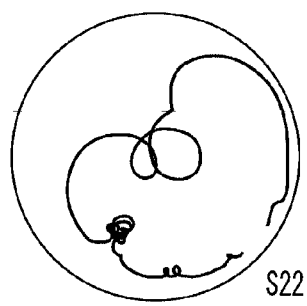
Figure 20A:
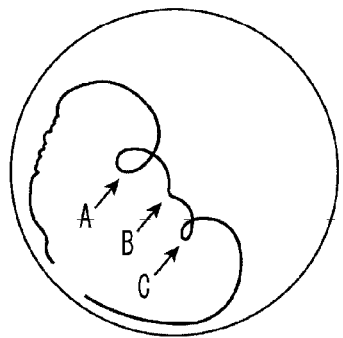
FIGS. 20A and 20B are Smith charts showing reflection characteristics on the S11 side and the S22 side obtained when the number of electrode fingers connected to the balanced signal terminal of the narrow pitch electrode finger section in the surface acoustic wave filter according to the second preferred embodiment is changed from three to five.
Figure 20B:
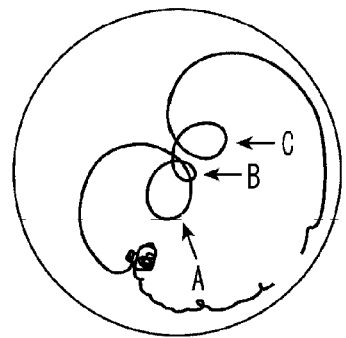

FIGS. 17 and 18 show an attenuation frequency characteristic and a VSWR characteristic of the surface acoustic wave filter according to the second preferred embodiment, and FIGS. 19A and 19B are Smith charts showing a reflection characteristic on the S11 side and a reflection characteristic on the S22 side.

As is apparent from the comparison between FIGS. 5 to 7B and FIGS. 17 to 19B, in the second preferred embodiment, the maximum insertion loss in the pass band of the DCS reception filter is about 1.96 dB and the maximum value of the VSWR is about 1.90. Therefore, compared with the characteristics shown in FIGS. 5 to 7B, according to the second preferred embodiment, the maximum insertion loss in the pass band is reduced by about 0.20 dB, and the VSWR is reduced by about 0.10.

In the second preferred embodiment, the reason why the filter characteristic is improved as compared with the above-mentioned comparison example is as follows. As is apparent from the reflection characteristics of FIGS. 11A and 11B, in order for the impedance on the S11 side to be set high, the impedance of the S22 side is set low, and the number of electrode fingers of the IDT may be changed. From the reflection characteristics shown in FIGS. 11A and 11B, FIGS. 20A and 20B show the reflection characteristics on the S11 side and the S22 side when the number of electrode fingers of the narrow pitch electrode finger section N connected to the balanced output terminals 7 and 9 is increased from 3 to 5. As is apparent from FIGS. 20A and 20B, it is understood that the resonance B approaches the impedance matching point in the reflection characteristics on both of the S11 side and the S22 side. That is, the impedance of the resonance B, which cannot be adjusted by only changing the number of electrode fingers of the IDT, can be adjusted by changing the number of electrode fingers of the narrow pitch electrode finger section N of the IDTs 4a, 4c, 5a, and 5c connected to the balanced output terminals 7 and 9. Then, eventually, the number of electrode fingers of the narrow pitch electrode finger sections N of the IDTs 4a to 4c and 5a to 5c connected to the unbalanced input terminal 3 and the balanced output terminals 7 and 9 are optimized, thereby obtaining the characteristics of the second preferred embodiment described above.

As described above, in the second preferred embodiment, the second IDT of the longitudinally coupled resonator type surface acoustic wave filter sections 4 and 5 is connected to the unbalanced input terminal 3, the IDTs 4a and 4c, and 5a and 5c on both sides thereof are respectively connected to the first and second balanced output terminals 7 and 9, whereby in the surface acoustic wave filter provided with a balance-unbalance conversion function, with the configuration in which N1<N2 and P1<P2 are satisfied, a surface acoustic wave filter is provided in which not only the impedance ratio between the unbalanced input terminal 3 and the balanced output terminals 7 and 9 can be set to about 1:2, but also, the insertion loss and the VSWR in the pass band are greatly improved.

It should be noted that P1<P2 is satisfied in this preferred embodiment, however, if P1≠P2 is satisfied, similar to this preferred embodiment, while ensuring the satisfactory film characteristic, the impedance ratio between the unbalanced input terminal 3 and the balanced output terminals 7 and 9 can be set to about 1:2. However, preferably, as described above, when P1<P2 is satisfied, the VSWR in the pass band is further reduced.

Other Preferred Embodiments

In the first and second preferred embodiments, for the impedance adjustment, the electrode finger pitch P1 of the second IDTs 4b and 5b connected to the unbalanced input terminal 3 is set to be different from the electrode finger pitch P2 of the narrow pitch electrode finger section N of the IDTs 4a and 4c, and 5a and 5c connected to the balanced output terminals 7 and 9. However, another impedance adjustment method of setting the IDT duty different for every IDT may be used in combination therewith.

Figure 21:
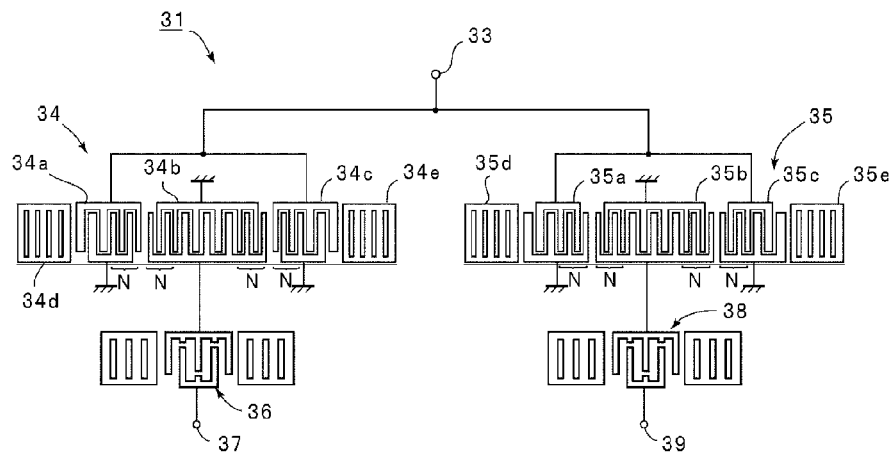
FIG. 21 is a schematic diagram showing a surface acoustic wave filter according to a third preferred embodiment of the present invention.
Figure 22:
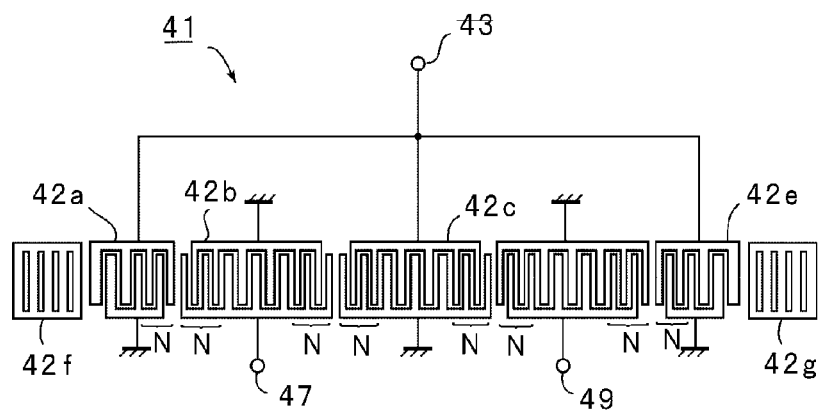
FIG. 22 is a schematic diagram showing a surface acoustic wave filter according to a fourth preferred embodiment of the present invention.
Figure 23:
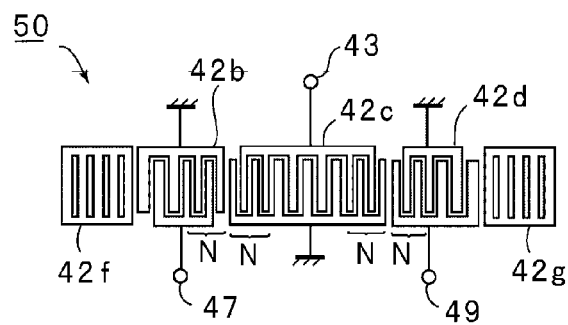
FIG. 23 is a schematic diagram showing a surface acoustic wave filter according to a fifth preferred embodiment of the present invention.

Then, in the first and second preferred embodiments, the surface acoustic wave filter 1 provided with the balance-unbalance conversion function is configured to include three IDTs, the second IDT 4b and 5b located in the center are connected to the unbalanced input terminal, and the IDTs 4a, 4c, 5a, and 5c located on the left and right sides are connected to the balanced output terminals 7 and 9. However, the present invention is not limited to the surface acoustic wave filter 1 provided with the balance-unbalance conversion function of such an electrode construction. FIGS. 21 to 23 show schematic plan views of an electrode configuration of a surface acoustic wave filter according to third to fifth preferred embodiments of the present invention.

As shown in FIG. 21, in a balanced-type surface acoustic wave filter 31 of a third preferred embodiment, the first and second longitudinally coupled resonator type surface acoustic wave filter sections 34 and 35 are connected to an unbalanced input terminal 33. The surface acoustic wave filter sections 34 and 35 are constructed similarly to the surface acoustic wave filter sections 4 and 5 of the surface acoustic wave filter 1 according to the first preferred embodiment. However, in the surface acoustic wave filter section 34, first and third IDTs 34a and 34c on both the sides of the surface acoustic wave propagating direction are connected to an unbalanced input terminal 33. Then, a second IDT 34b located in the center is electrically connected to a first balanced output terminal 37 via a 1-port type surface acoustic wave resonator 36. Reflectors 34d and 34e are arranged on both sides in the surface acoustic wave propagating direction of the area where the IDT 34a to 34c are provided. The 1-port type surface acoustic wave resonator 36 is similar to the 1-port type surface acoustic wave resonator 6.

In the surface acoustic wave filter section 35, first and third IDTs 35a and 35c on both sides are connected to an unbalanced input terminal 33, a second IDT 35b is connected to a second balanced output terminals 39 via a 1-port type surface acoustic wave resonator 38. That is, in the surface acoustic wave filter 31, the first and third IDTs 34a, 34c, 35a and 35c in the surface acoustic wave propagating direction are electrically connected to the unbalanced input terminal 33 and the second IDT in the center 34b and 35b are electrically connected to the first and second balanced output terminals 37 and 39.

In this case, as in the first preferred embodiment, when the electrode finger pitch of the narrow pitch electrode finger section of the IDT 34a, 34c, 35a and 35c connected to the unbalanced input terminal 33 is set as P1, an electrode finger pitch of the narrow pitch electrode finger section of the IDT 34b and 35b connected to the balanced output terminals 37 and 39 is set as P2, the number of electrode fingers of the electrode finger section except for the narrow pitch electrode finger section of the IDT 34a, 34c, 35a and 35c connected to the unbalanced input terminal 33 is set as K1, the number of electrode fingers of the narrow pitch electrode finger section thereof is set as K1n, the number of electrode fingers of the electrode finger section except for the narrow pitch electrode finger section of the IDT 34b and 35b connected to the balanced output terminals 37 and 39 is set as K2, and the number of electrode fingers of the narrow pitch electrode finger section thereof is set as K2n, by setting of P1>P2 and $1.12 \leq K1/K2 \leq 1.65$, and more preferably by setting of K1n=K2n, the balanced-type surface acoustic wave filter is provided in which the insertion loss and the VSWR in the pass band are greatly reduced, the filter characteristic is satisfactory, and at the same time the impedance ratio between the unbalanced input terminal and the balanced output terminals 37 and 39 is set to about 1:2.

It should be noted that in the third preferred embodiment, preferably, while the metallization ratio of the first and second surface acoustic wave filter sections 34 and 35 is set to d and an electrode finger cross width is set as W, in the case where 67.4 λI≦W/d≦74.3 λI is satisfied and therefore the impedance on the unbalanced input terminal 33 side is set to 50 Ω, the output impedance on the side of the balanced output terminals 37 and 39 can be easily set to 100Ω.

Then, in the third preferred embodiment, as in the second preferred embodiment, P1≠P2 is set, and preferably, P1<P2 is set. When the number of electrode fingers of the narrow pitch electrode finger section of the IDT 34a, 34c, 35a and 35c connected to the unbalanced input terminal 33 is set as N1 and the number of electrode fingers of the narrow pitch electrode finger section of the IDTs connected to the first and second balanced output terminals 37 and 39 is set as N2, by setting N1<N2, the degree of freedom for adjusting impedances of a plurality of resonant modes is greatly increased. Therefore, the insertion loss and the VSWR in the pass band are reduced, and not only the satisfactory film characteristic is obtained, but also the impedance ratio between the unbalanced input terminal 33 and the balanced output terminals 37 and 39 can be set to about 1:2.

FIG. 22 is a schematic plan view showing an electrode construction of a surface acoustic wave filter section 41 according to a fourth preferred embodiment. In the balanced-type surface acoustic wave filter 41 of the fourth preferred embodiment, five IDTs 42a to 42e are arranged along the surface acoustic wave propagating direction. Reflectors 42f and 42g are arranged on both sides in the surface acoustic wave propagating direction of an area where the IDTs 42a to 42e are arranged. The IDTs 42a to 42e includes the narrow pitch electrode finger sections N similarly to the IDTs 4a to 4c. That is, in a pair of IDTs adjacent to each other in the surface acoustic wave propagating direction with a gap interposed therebetween, a pitch of electrode fingers of a portion of electrode fingers including electrode fingers facing the gap is less than an electrode finger pitch of the remaining IDTs.

In the surface acoustic wave filter section 41, the IDTs 42a, 42c, and 42e are connected to an unbalanced input terminal 43. Then, the IDTs 42b and 42d are respectively electrically connected to the first and second balanced output terminals 47 and 49. In the surface acoustic wave filter section 4 provided with such a balance-unbalance conversion function, when the electrode finger pitch of the narrow pitch electrode finger section N of the IDTs 42a, 42c, and 42e connected to the unbalanced input terminal 43 is set as P1, the number of electrode fingers of the narrow pitch electrode finger section N thereof is K1n, the number of electrode fingers except for the narrow pitch electrode finger section thereof is K1, the electrode finger pitch of the narrow pitch electrode finger section N of the IDTs 42b and 42d connected to the balanced output terminals 47 and 49 is P2, the number of electrode fingers of the narrow pitch electrode finger section thereof is K2n, and the number of electrode fingers except for the narrow pitch electrode finger section thereof is K2, and by setting of P1>P2 and 1.12≦K1/K2≦1.65, and preferably, by further setting of K1n=K2n, reduction in the insertion loss and the VSWR in the pass band is achieved, and the impedance ratio between the unbalanced input terminal 43 and the balanced output terminals 47 and 49 can be set to about 1:2. Preferably, by setting of 134.8 λI≦W/d≦148.6 λI, when the impedance on the unbalanced input terminal 43 side is set to 50 Ω, the impedance on the side of the balanced output terminals 47 and 49 can be easily set to 100Ω.

In addition, in the fourth preferred embodiment, as in the second preferred embodiment, by also setting P2>P1 and N2>N1, the impedance ratio between the unbalanced input terminal and the balanced output terminals can be easily set to about 1:2, and at the same time, the reduction in the insertion loss and the VSWR in the pass band is achieved.

FIG. 23 is a schematic plan view showing an electrode configuration of a balanced-type surface acoustic wave filter of a fifth preferred embodiment. A surface acoustic wave filter 50 according to the fifth preferred embodiment is constructed similar to the surface acoustic wave filter 41 according to the fourth preferred embodiment except that the number of the IDTs is three. That is, in a balanced-type surface acoustic wave filter 50 according to the fifth preferred embodiment, three IDT 42b to 42d are arranged along the surface acoustic wave propagating direction. Reflectors 42f and 42g are arranged on both sides in the surface acoustic wave propagating direction of an area where the first to third IDTs 42b to 42d are provided.

Therefore, except for the omission of IDTs 42a and 42e of FIG. 22, the surface acoustic wave filter 50 is similar to the surface acoustic wave filter 41. Therefore, the same reference numerals are used for the same components with the incorporation of the description with respect to FIG. 22.

In this preferred embodiment, by setting of P1>P2 and 1.12≦K1/K2≦1.65, and preferably, by further setting of K1n=K2n, as in the case of the fourth preferred embodiment, the reduction in the insertion loss and the VSWR in the pass band is achieved and the impedance ratio between the unbalanced input terminal 43 and the balanced output terminals 47 and 49 can be set to about 1:2. In addition, preferably, by setting of 134.8 λI≦W/d≦148.6 λI, when the impedance on the unbalanced input terminal 43 side is set to 50 Ω, the impedance on the side of the balanced output terminals 47 and 49 can be easily set to 100Ω.

In addition, in the fifth preferred embodiment, as in the second preferred embodiment, by setting N2>N1 and P2≠P1, and preferably by setting N2>N1 and P2>P1, the impedance ratio between the unbalanced input terminal and the balanced output terminals can be easily set to about 1:2, and at the same time, the reduction in the insertion loss and the VSWR in the pass band is achieved.

Figure 24:
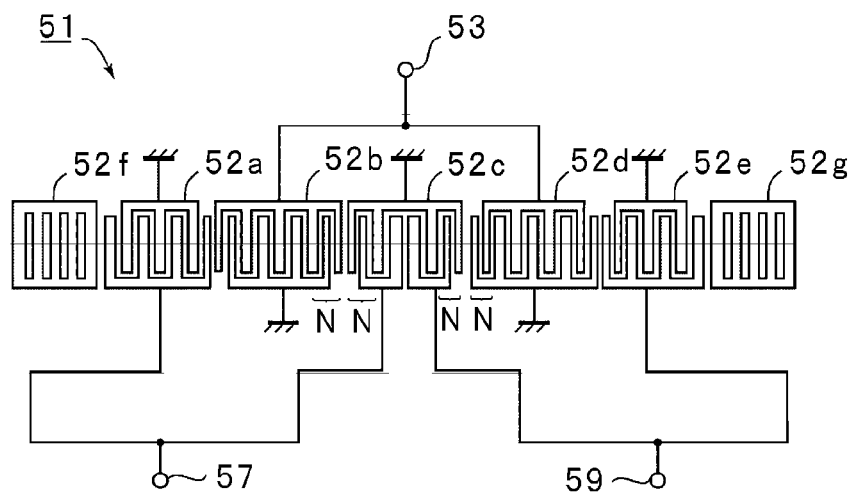
FIG. 24 is a schematic diagram showing a surface acoustic wave filter according to a sixth preferred embodiment of the present invention.

FIG. 24 is schematic plan view showing an electrode construction of a balanced-type surface acoustic wave filter of a sixth preferred embodiment. In a balanced-type surface acoustic wave filter 51 according to the sixth preferred embodiment, five IDTs 52a to 52e are arranged along the surface acoustic wave propagating direction. The IDTs 52a to 52e include the narrow pitch electrode finger sections N similar to the IDTs 42a to 42e. Reflectors 52f and 52g are arranged on both sides in the surface acoustic wave propagating direction of an area where the IDTs 52a to 52e are provided. It should be noted that the IDT 52c in the center includes IDT sections 52c1 and 52c2 that are divided in the surface acoustic wave propagating direction.

In this preferred embodiment, the IDTs 52b and 52d are electrically connected to an unbalanced input terminal 53. Then, IDT 52a and the IDT section 52c1 are electrically connected to a first balanced output terminal 57 and the IDT section 52c2 and the IDT 52e are electrically connected to a balanced output terminal 59, thereby providing the balance-unbalance conversion function.

In this preferred embodiment, when the electrode finger pitch of the narrow pitch electrode finger section N in the IDTs 52b and 52d connected to the unbalanced input terminal 53 is set as P1, the number of electrode fingers of the narrow pitch electrode finger section N thereof is K1n, the number of electrode fingers of the electrode finger section except for the narrow pitch electrode finger section is K1, the electrode finger pitch of the narrow pitch electrode finger section N of the IDTs 52a, 52c, and 52e connected to the balanced output terminals 57 and 59 is P2, the number of electrode fingers of the narrow pitch electrode finger section thereof is K2n, the number of electrode fingers of the electrode finger section except for the narrow pitch electrode finger section is K2, P1>P2 and 1.12≦K1/K2≦1.65 are satisfied, and preferably, K1n=K2 is satisfied, without degrading the filter characteristic similar to the respective above-mentioned preferred embodiments, the impedance ratio between the unbalanced signal terminal and the balanced signal terminal can be set to about 1:2. In the sixth preferred embodiment, preferably, 134.8 λI≦W/d≦148.6 λI is satisfied, when the impedance connected to the unbalanced input terminal 53 side is set to about 50 Ω, the impedance on the side of the balanced output terminals 57 and 59 can be easily set to about 100Ω.

In addition, in the sixth preferred embodiment, as in the second preferred embodiment, P1≠P2 and N1<N2 are satisfied, and preferably, P1<P2 and N1<N2 are satisfied. Thus, as in the second preferred embodiment, it is possible to provide the surface acoustic wave filter in which the impedance ratio between the unbalanced input terminal 53 and the balanced output terminals 57 and 59 is about 1:2, and also the insertion loss and the VSWR are reduced in the pass band.

Figure 25:
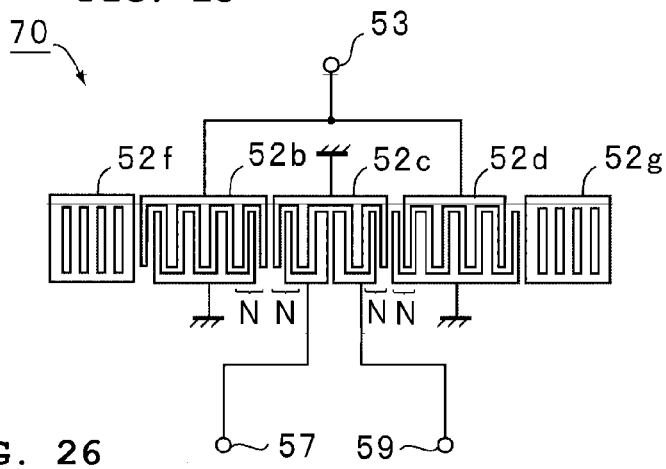
FIG. 25 is a schematic diagram showing a surface acoustic wave filter according to a seventh preferred embodiment of the present invention.
Figure 26:
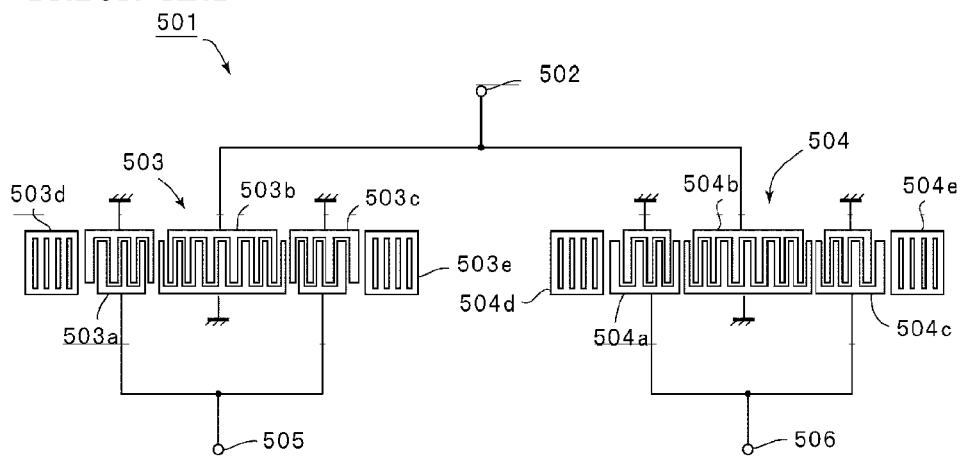
FIG. 26 is a schematic diagram showing an example of a related-art balanced-type surface acoustic wave filter.
Figure 27:
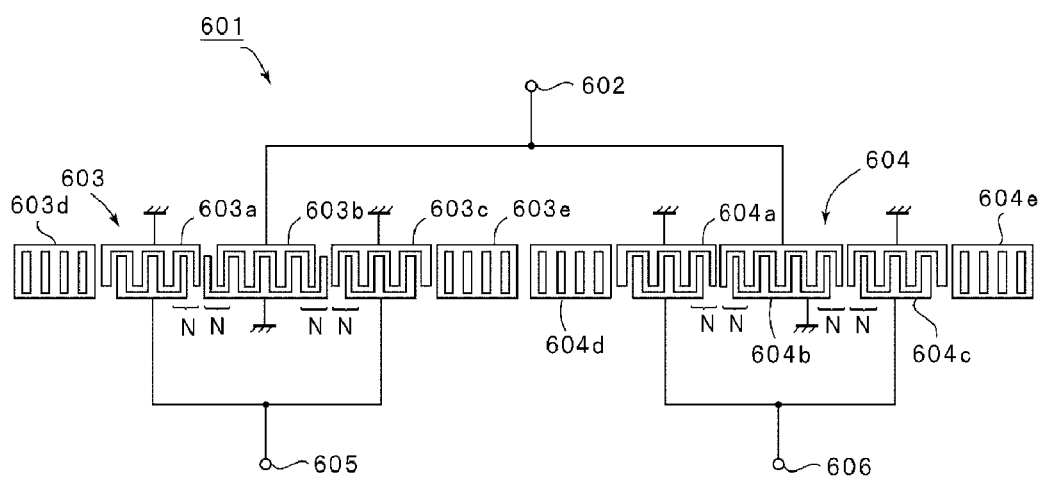
FIG. 27 is a schematic diagram showing another example of the related-art the balanced-type surface acoustic wave filter.

FIG. 25 is a schematic plan view showing an electrode configuration of a balanced-type surface acoustic wave filter according to a seventh preferred embodiment. A surface acoustic wave filter 70 according to the seventh preferred embodiment preferably has almost the same configuration as the surface acoustic wave filter 51 according to the sixth preferred embodiment shown in FIG. 24, except that the IDTs 52a and 52e are omitted. Therefore, the same reference numerals are used for the same components, and the description made with reference to the sixth preferred embodiment is incorporated herein.

In this preferred embodiment, the first to third IDTs 52b to 52d are arranged along the surface acoustic wave propagating direction. Then, the second IDT in the center 52c is divided so as to have the IDT sections 52c1 and 52c2. In this preferred embodiment, as in the sixth preferred embodiment, by satisfying P1>P2 and 1.12≦K1/K2≦1.65, and preferably, by further satisfying K1n=K2n, the impedance ratio between the unbalanced input terminal and the balanced output terminal can be set to about 1:2 without degrading the filter characteristic. In addition, in the seventh preferred embodiment, preferably, by satisfying 134.8 λI≦W/d≦148.6 λI, when the impedance on the unbalanced input terminal 53 side is set to about 50 Ω, it is possible to easily set the impedance on the side of the balanced output terminals 57 and 59 to about 100Ω.

Then, according to seventh preferred embodiment, as in the second preferred embodiment, with P1≠P2 and N1<N2 being satisfied, and preferably, with P1<P2 and N1<N2 being satisfied, the surface acoustic wave filter is provided in which the impedance ratio between the unbalanced input terminal 53 and the balanced output terminals 57 and 59 is set to about 1:2 and the insertion loss and the VSWR are reduced in the pass band.

It should be noted that in the surface acoustic wave filters 41 and 51 according to the fourth and sixth preferred embodiments, the five IDTs 42a to 42e and 52a to 52e are provided. In this manner, in the surface acoustic wave filters according to preferred embodiments of the present invention, not only the three IDTs including the first to third IDTs, but also five or more IDTs may be arranged in the surface acoustic wave propagating direction.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A balanced-type surface acoustic wave filter connected to an unbalanced terminal and first and second balanced terminals and provided with a balance-unbalance conversion function, comprising:

a piezoelectric substrate;

a first surface acoustic wave filter section including first to third IDTs arranged along a surface acoustic wave propagating direction on the piezoelectric substrate, one of the second IDT disposed in a center and the first and third IDTs disposed on both sides of the second IDT being connected to the unbalanced terminal, and the other of the first and third IDTs and the second IDT being connected to the first balanced terminal; and a second surface acoustic wave filter section including first to third IDTs arranged in the surface acoustic wave propagating direction on the piezoelectric substrate, one of the second IDT disposed in a center and the first and third IDTs disposed on both sides of the second IDT being connected to the unbalanced terminal, one of the first and third IDTs and the second IDT being connected to the second balanced terminal, and the second surface acoustic wave filter section having a phase of an output signal to an input signal different by about 180 degrees with respect to the first surface acoustic wave filter section; wherein in the first and second surface acoustic wave filter sections, in a pair of IDTs adjacent to each other with a gap interposed therebetween in the surface acoustic wave propagating direction, a section where a cycle of a portion of electrode fingers including an electrode finger facing the gap is less than a cycle of electrode fingers of a main portion of the IDT is set as a narrow pitch electrode finger section; and when an electrode finger pitch of the narrow pitch electrode finger section of the IDT connected to the unbalanced terminal of the first and second surface acoustic wave filter sections is P1, an electrode finger pitch of the narrow pitch electrode finger section of the IDT connected to the balanced terminal is P2, the number of electrode fingers of the main portion of the IDT connected to the unbalanced terminal of the first and second surface acoustic wave filter sections is K1, and the number of electrode fingers of the main portion of the IDT connected to the balanced terminal is K2, the following relationships:

P1>P2; and 1.12≦K1/K2≦1.65 are satisfied.

2. The balanced-type surface acoustic wave filters according to claim 1, wherein when a metallization ratio in the first and second surface acoustic wave filter sections is d and an electrode finger cross width is W, 67.4 λI≦W/d≦74.3 λI (where λI denotes a wavelength of the IDT) is satisfied.

3. A balanced-type surface acoustic wave filter connected to an unbalanced terminal and first and second balanced terminals and provided with a balance-unbalance conversion function, comprising:

a piezoelectric substrate;

a first surface acoustic wave filter section including first to third IDTs arranged along a surface acoustic wave propagating direction on the piezoelectric substrate, one of the second IDT disposed in a center and the first and third IDTs disposed on both sides of the second IDT being connected to the unbalanced terminal, and the other of the first and third IDTs and the second IDT being connected to the first balance terminal; and a second surface acoustic wave filter section including first to third IDTs arranged in the surface acoustic wave propagating direction on the piezoelectric substrate, one of the second IDT disposed in a center and the first and third IDTs disposed on both sides of the second IDT being connected to the unbalanced terminal, the other of the first and third IDTs and the second IDT being connected to the second balanced terminal, and the second surface acoustic wave filter section having a phase of an output signal to an input signal different by about 180 degrees with respect to the first surface acoustic wave filter section; wherein in the first and second surface acoustic wave filter sections, in a pair of IDTs adjacent to each other with a gap interposed therebetween in the surface acoustic wave propagating direction, a section where a cycle of a portion of electrode fingers including an electrode finger facing the gap is less than a cycle of electrode fingers of a main portion of the IDT is set as a narrow pitch electrode finger section; and when an electrode finger pitch of the narrow pitch electrode finger section of the IDT connected to the unbalanced terminal of the first and second surface acoustic wave filter sections is P1, an electrode finger pitch of the narrow pitch electrode finger section of the IDT connected to the balanced terminal is P2, the number of electrode fingers of the main portion of the IDT connected to the unbalanced terminal of the first and second surface acoustic wave filter sections is K1, the number of electrode fingers of the main portion of the IDT connected to the balanced terminal is K2, the number of electrode fingers of the narrow pitch electrode finger section of the IDT connected to the unbalanced terminal of the first and second surface acoustic wave filter sections is K1n, and the number of electrode fingers of the narrow pitch electrode finger section of the IDT connected to the balanced terminal is K2n, the following relationships:

P1>P2;

K1n=K2n; and $1.12 \leq K1/K2 \leq 1.65$ are satisfied.

4. The balanced-type surface acoustic wave filters according to claim 3, wherein when a metallization ratio in the first and second surface acoustic wave filter sections is d and an electrode finger cross width is W, $67.4 \lambda I \leq W/d \leq 74.3 \lambda I$ (where $\lambda I$ denotes a wavelength of the IDT) is satisfied.

5. A balanced-type surface acoustic wave filter connected to an unbalanced terminal and first and second balanced terminals and provided with a balance-unbalance conversion function, comprising:

a piezoelectric substrate; and first to third IDTs arranged in a surface acoustic wave propagating direction on the piezoelectric substrate; wherein the second IDT is connected to the unbalanced terminal and the first and third IDTs disposed on both sides of the second IDT are respectively connected to the first and second balanced terminals;

in an area where the first to third IDTs are adjacent one another, the respective IDTs have narrow pitch electrode finger sections and an electrode finger pitch of the narrow pitch electrode finger section is less than an electrode finger pitch of a main portion of the respective IDT;

a phase of the first IDT is reversed by about 180 degrees with respect to a phase of the third IDT; and when an electrode finger pitch of the narrow pitch electrode finger section of the second IDT located is set as P1, an electrode finger pitch of the narrow pitch electrode finger section of the first and third IDTs is P2, the number of electrode fingers of the main portion of the second IDT is K1, and the number of electrode fingers of the main portion of the first and third IDTs is K2, the following relationships:

P1>P2; and $1.12 \leq K1/K2 \leq 1.65$ are satisfied.

6. The balanced-type surface acoustic wave filters according to claim 5, wherein when a metallization ratio in the first to third IDTs is d and an electrode finger cross width is W, $134.8 \lambda I \leq W/d \leq 148.6 \lambda I$ (where $\lambda I$ denotes a wavelength of the IDT) is satisfied.

7. A balanced-type surface acoustic wave filter connected to an unbalanced terminal and first and second unbalanced terminals and provided with a balance-unbalance conversion function, comprising:

a piezoelectric substrate; and first to third IDTs arranged in a surface acoustic wave propagating direction on the piezoelectric substrate; wherein the second IDT is connected to the unbalanced terminal and the first and third IDTs disposed on both sides of the second IDT are respectively connected to the first and second balanced terminals;

in an area where the first to third IDTs are adjacent one another, the respective IDTs have narrow pitch electrode finger sections and an electrode finger pitch of the narrow pitch electrode finger section is less than an electrode finger pitch of a main portion of the respective IDT;

a phase of the first IDT is reversed by about 180 degrees with respect to a phase of the third IDT; and when an electrode finger pitch of the narrow pitch electrode finger section of the second IDT located in the center is P1, an electrode finger pitch of the narrow pitch electrode finger section of the first and third IDTs is P2, the number of electrode fingers of the main portion of the second IDT is K1, the number of electrode fingers of the main portion of the first and third IDTs is K2, the number of electrode fingers of the narrow pitch electrode finger section of the second IDT is K1n, the number of electrode fingers of the narrow pitch electrode finger section of the first and third IDTs is K2n, the following relationships:

P1>P2;

K1n=K2n; and $1.12 \leq K1/K2 \leq 1.65$ are satisfied.

8. The balanced-type surface acoustic wave filters according to claim 7, wherein when a metallization ratio in the first to third IDTs is d and an electrode finger cross width is W, 134.8 λI≦W/d≦148.6 λI (where λI denotes a wavelength of the IDT) is satisfied.

9. A balanced-type surface acoustic wave filter connected to an unbalanced terminal and first and second balanced terminals and provided with a balance-unbalance conversion function, comprising:

a piezoelectric substrate; and first to third IDTs arranged in a surface acoustic wave propagating direction on the piezoelectric substrate; wherein the first and third IDTs disposed on both sides in a surface acoustic wave propagating direction are connected to the unbalanced terminal;

the second IDT includes first and second IDT sections divided in the surface acoustic wave propagating direction, the first and second IDT sections are respectively electrically connected to the first and second balanced signal terminals, and the first to third IDTs are arranged such that a phase of a signal emanating from the unbalanced terminal to the first balanced signal terminal is reversed by about 180 degrees with respect to a phase of a signal emanating from the unbalanced terminal to the second balanced signal terminal;

in an area where the first to third IDTs are adjacent one another in the surface acoustic wave propagating direction with a gap interposed therebetween, a plurality of electrode fingers near the gap correspond to a narrow pitch electrode finger section where a pitch of the electrode fingers is relatively small; and when an electrode finger pitch of the narrow pitch electrode finger section of the first and third IDTs connected to the unbalanced signal terminal is P1, an electrode finger pitch of the narrow pitch electrode finger section of the second IDT whose first and second IDT sections are respectively connected to the first and second balanced signal terminal is P2, the number of electrode fingers of an electrode finger section excluding the narrow pitch electrode finger section of the first and third IDTs is K1, and the number of electrode fingers of an electrode finger section excluding the narrow pitch electrode finger section of the second IDT is K2, the following relationships:

P1>P2; and 1.12≦K1/K2≦1.65 are satisfied.

10. The balanced-type surface acoustic wave filters according to claim 9, wherein when a metallization in the first to third IDTs is d and an electrode finger cross width is W, 134.8 λI≦W/d≦148.6 λI (where λI denotes a wavelength of the IDT) is satisfied.

11. A balanced-type surface acoustic wave filter connected to an unbalanced terminal and first and second balanced terminals and provided with a balance-unbalance conversion function, comprising:

a piezoelectric substrate; and first to third IDTs arranged in a surface acoustic wave propagating direction on the piezoelectric substrate; wherein the first and third IDTs disposed on both the sides in a surface acoustic wave propagating direction are connected to the unbalanced terminal;

the second IDT includes first and second IDT sections divided in the surface acoustic wave propagating direction, the first and second IDT sections are respectively electrically connected to the first and second balanced signal terminals, and the first to third IDTs are arranged such that a phase of a signal emanating from the unbalanced terminal to the first balanced signal terminal reversed by about 180 degrees with respect to a phase of a signal emanating from the unbalanced terminal to the second balanced signal terminal; and in an area where the first to third IDTs are adjacent one another in the surface acoustic wave propagating direction with a gap interposed therebetween, a plurality of electrode fingers near the gap correspond to a narrow pitch electrode finger section where a pitch of the electrode fingers is relatively small, and when an electrode finger pitch of the narrow pitch electrode finger section of the first and third IDTs connected to the unbalanced signal terminal is P1, an electrode finger pitch of the narrow pitch electrode finger section of the second IDT whose first and second IDT sections are respectively connected to the first and second balanced signal terminal is P2, the number of electrode fingers of an electrode finger section excluding the narrow pitch electrode finger section of the first and third IDTs is K1, the number of electrode fingers of an electrode finger section excluding the narrow pitch electrode finger section of the second IDT is K2, the number of electrode fingers of the narrow pitch electrode finger section of the first and third IDTs is K1n, and the number of electrode fingers of the narrow pitch electrode finger section of the second IDT is K2n, the following relationships:

P1>P2;

K1n=K2n; and 1.12≦K1/K2≦1.65 are satisfied.

12. The balanced-type surface acoustic wave filters according to claim 11, wherein when a metallization in the first to third IDTs is d and an electrode finger cross width is W, 134.8 λI≦W/d≦148.6 λI (where λI denotes a wavelength of the IDT) is satisfied.

13. A balanced-type surface acoustic wave filter connected to an unbalanced terminal and first and second balanced terminals and provided with a balance-unbalance conversion function, comprising:

a piezoelectric substrate;

a first surface acoustic wave filter section including first to third IDTs arranged along a surface acoustic wave propagating direction on the piezoelectric substrate, one of the second IDT disposed in a center or the first and third IDTs disposed on both sides of the second IDT being connected to the unbalanced terminal, and the other of the first and third IDTs and the second IDT being connected to the first balanced terminal; and a second surface acoustic wave filter section including first to third IDTs arranged in the surface acoustic wave propagating direction on the piezoelectric substrate, one of the second IDT disposed in a center or the first and third IDTs disposed on both sides of the second IDT being connected to the unbalanced terminal, the other of the first and third IDTs and the second IDT being connected to the second balanced terminal, and the second surface acoustic wave filter section having a phase of an output signal to an input signal different by about 180 degrees with respect to the first surface acoustic wave filter section; wherein in the first and second surface acoustic wave filter sections, in a pair of IDTs adjacent to each other with a gap interposed therebetween in the surface acoustic wave propagating direction, a section where a cycle of a portion of electrode fingers including an electrode finger facing the gap is less than a cycle of electrode fingers of a main portion of the IDT is set as a narrow pitch electrode finger section; and when an electrode finger pitch of the narrow pitch electrode finger section of the IDT connected to the unbalanced terminal of the first and second surface acoustic wave filter sections is P1, the number of electrode fingers of the narrow pitch electrode finger section thereof is N1, an electrode finger pitch of the narrow pitch electrode finger section of the IDT connected to the first and second balanced terminals is P2, and the number of electrode fingers of the narrow pitch electrode finger section thereof is N2, the following relationships:

P1≠P2; and

N1<N2 are satisfied.

14. The balanced-type surface acoustic wave filter according to claim 13, wherein P1<P2 is satisfied.

15. A balanced-type surface acoustic wave filter connected to an unbalanced terminal and first and second balanced terminals and provided with a balance-unbalance conversion function, comprising:

a piezoelectric substrate; and first to third IDTs arranged in a surface acoustic wave propagating direction on the piezoelectric substrate; wherein the second IDT is connected to the unbalanced terminal and the first and third IDTs are respectively connected to the first and second balanced terminals;

in an area where the first to third IDTs are adjacent one another, the respective IDTs have narrow pitch electrode finger sections and an electrode finger pitch of the narrow pitch electrode finger section is less than an electrode finger pitch of a main portion of the respective IDT;

a phase of the first IDT is reversed by about 180 degrees with respect to a phase of the third IDT; and when an electrode finger pitch of the narrow pitch electrode finger section of the second IDT connected to the unbalanced terminal is P1, the number of electrode fingers of the narrow pitch electrode finger section thereof is N1, an electrode finger pitch of the narrow pitch electrode finger section of the first and third IDTs connected to the first and second balanced terminals is P2, and the number of electrode fingers of the narrow pitch electrode finger section thereof is N2, the following relationships:

P1≠P2; and

N1<N2 are satisfied.

16. The balanced-type surface acoustic wave filter according to claim 15, wherein P1<P2 is satisfied.

17. A balanced-type surface acoustic wave filter connected to an unbalanced terminal and first and second balanced terminals and provided with a balance-unbalance conversion function, comprising:

a piezoelectric substrate; and first to third IDTs arranged in a surface acoustic wave propagating direction on the piezoelectric substrate; wherein the first and third IDTs located on both sides in a surface acoustic wave propagating direction are connected to the unbalanced terminal;

the second IDT includes first and second IDT sections divided in the surface acoustic wave propagating direction, the first and second IDT sections are respectively electrically connected to the first and second balanced signal terminals, and the first to third IDTs are arranged such that a phase of a signal emanating from the unbalanced terminal to the first balanced signal terminal reversed by about 180 degrees with respect to a phase of a signal emanating from the unbalanced terminal to the second balanced signal terminal;

in an area where the first to third IDTs are adjacent one another in the surface acoustic wave propagating direction with a gap interposed therebetween, the respective IDTs have narrow pitch electrode finger sections at areas near the gap; and when an electrode finger pitch of the narrow pitch electrode finger section of the first and third IDTs connected to the unbalanced signal terminal is P1, the number of electrode fingers of the narrow pitch electrode finger section thereof is N1, an electrode finger pitch of the narrow pitch electrode finger section of the second IDT whose first and second IDT sections are respectively connected to the first and second balanced signal terminal is P2, and the number of electrode fingers of the narrow pitch electrode finger section thereof is N2, the following relationships:

P1≠P2; and

N1<N2 are satisfied.

18. The balanced-type surface acoustic wave filter according to claim 17, wherein P1<P2 is satisfied.

* * * * *